(12) United States Patent
Elber et al.

(10) Patent No.: US 10,726,618 B2
(45) Date of Patent: Jul. 28, 2020

(54) SYSTEMS AND METHODS FOR GENERATING VOLUMETRIC MODELS

(71) Applicant: Technion Research & Development Foundation Limited, Haifa (IL)

(72) Inventors: Gershon Elber, Haifa (IL); Fady Massarwi, Baka al Gharbiya (IL)

(73) Assignee: Technion Research & Development Foundation Limited, Haifa (IL)

( * ) Notice: Subject to any disclaimer, the term of this patent is extended or adjusted under 35 U.S.C. 154(b) by 0 days.

(21) Appl. No.: 16/095,705

(22) PCT Filed: May 24, 2017

(86) PCT No.: PCT/IL2017/050578
§ 371 (c)(1),
(2) Date: Oct. 23, 2018

(87) PCT Pub. No.: WO2017/203528
PCT Pub. Date: Nov. 30, 2017

(65) Prior Publication Data
US 2019/0130642 A1    May 2, 2019

Related U.S. Application Data

(60) Provisional application No. 62/340,556, filed on May 24, 2016.

(51) Int. Cl.
*G06T 17/10* (2006.01)
*G06F 30/20* (2020.01)
(Continued)

(52) U.S. Cl.
CPC .............. *G06T 17/10* (2013.01); *G06F 30/20* (2020.01); *G06T 15/08* (2013.01); *G06T 17/005* (2013.01); *G06T 17/20* (2013.01); *G06T 17/30* (2013.01)

(58) Field of Classification Search
CPC ....... G06T 17/00; G06T 17/005; G06T 17/10; G06T 17/20; G06T 17/30
See application file for complete search history.

(56) References Cited

U.S. PATENT DOCUMENTS 6,193,923 B1    2/2001  Leyden et al.
2004/0246249 A1    12/2004  Deny et al.
(Continued)

FOREIGN PATENT DOCUMENTS

WO    WO 2017/203528    11/2017

OTHER PUBLICATIONS

Cao, Bing-wan, et al. "Cad/Cae integration framework with layered software architecture." 2009 11th IEEE International Conference on Computer-Aided Design and Computer Graphics. IEEE, 2009. (Year: 2009).*

(Continued)

*Primary Examiner* — Ryan McCulley

(57) ABSTRACT

There is provided a method of design and analysis of a geometric object comprising: receiving an initial definition of the geometric object in a coordinate system; generating a volumetric model according to the initial definition, the volumetric model comprises: volumetric cells each represented by one or more multivariate of three variables or more functions, and intra object general border surfaces in general orientation each defines topological adjacency between at least two of said plurality of volumetric cells.

27 Claims, 15 Drawing Sheets

(51) Int. Cl.
*G06T 17/20* (2006.01)
*G06T 15/08* (2011.01)
*G06T 17/00* (2006.01)
*G06T 17/30* (2006.01)

(56) References Cited

U.S. PATENT DOCUMENTS

| | | | |
|---|---|---|---|
| 2009/0024370 A1* | 1/2009 | Scott | G06F 17/5018 703/2 |
| 2011/0222081 A1 | 9/2011 | Yi et al. | |
| 2014/0028673 A1* | 1/2014 | Gregson | G06T 17/20 345/420 |
| 2015/0230874 A1 | 8/2015 | Musuvathy et al. | |
| 2015/0269289 A1 | 9/2015 | Kim et al. | |
| 2016/0240001 A1* | 8/2016 | Sheffer | G06T 17/20 |

OTHER PUBLICATIONS

Elber, Gershon, Yong-Joon Kim, and Myung-Soo Kim. "Volumetric boolean sum." Computer Aided Geometric Design 29.7 (2012): 532-540. (Year: 2012).*
Li, Bo, and Hong Qin. "Component-aware tensor-product trivariate splines of arbitrary topology." Computers & Graphics 36.5 (2012) : 329-340. (Year: 2012).*
Li, Bo, et al. "Generalized polycube trivariate splines." 2010 Shape Modeling International Conference. IEEE, 2010. (Year: 2010).*
U Li' Bo."A Spline-based Volumetric Data Modeling Framework and Its Applications." arXiv preprint arXiv:1308.0869 (2013). (Year: 2013).*
Liu, Lei, et al. "Volumetric T-spline construction using Boolean operations." Engineering with Computers 30.4 (2014): 425-439. Year: 2014).*
Martin, Tobias, Elaine Cohen, and Robert Michael Kirby. "Volumetric parameterization and trivariate B-spline fitting using harmonic functions." Computer aided geometric design 26.6 (2009): 648-664. (Year: 2009).*
Martin, Tobias, and Elaine Cohen. "Volumetric parameterization of complex objects by respecting multiple materials." Computers & Graphics 34.3 (2010): 187-197. (Year: 2010).*
Massarwi, Fady, and Gershon Elber. "A B-spline based framework for volumetric object modeling." Computer-Aided Design 78 2016): 36-47. (Year: 2016).*
Rank, Ernst, et al. "Geometric modeling, isogeometric analysis and the finite cell method." Computer Methods in Applied Mechanics and Engineering 249 (2012): 104-115. (Year: 2012).*
Wang, Kexiang, et al. "Restricted trivariate polycube splines for volumetric data modeling." IEEE Transactions on Visualization and Computer Graphics 18.5 (2011): 703-716. (Year: 2011).*
Wang, Xilu, and Xiaoping Qian. "An optimization approach for constructing trivariate B-spline solids." Computer-Aided Design 46 2014): 179-191. (Year: 2014).*
Wang, Wenyan, et al. "Trivariate solid T-spline construction from boundary triangulations with arbitrary genus topology." Computer-Aided Design 45.2 (2013): 351-360. (Year: 2013).*
Zuo, Bing-Quan, et al. "Isogeonnetric analysis for Csg models." Computer Methods in Applied Mechanics and Engineering 285 2015): 102-124. (Year: 2015).*
International Preliminary Report on Patentability Dated 06 Dec. 2018 From the International Bureau of Wipo Re. Application No. PCT/IL2017/050578. (8 pp.).
International Search Report and the Written Opinion Dated 24 Aug. 2017 From the international Searching Authority Re. Application No. PCT/IL2017/050578. (14 pp.).

* cited by examiner

Algorithm 1 V-Intersect: Intersection of two V-models

Input: V-models $V_M^1, V_M^2$;
Output: $V_M^{1 \cap 2}$, V-model of the intersection between $V_M^1$ and $V_M^2$;
Algorithm:

1: $\mathcal{V}_{Cells} := \emptyset$;              /* Set of updated/new V-cells */
2: for all $V_C^i \in \mathcal{S}_{V_C}(V_M^1)$ do
3:   for all $V_C^j \in \mathcal{S}_{V_C}(V_M^2)$ do
4:     $\mathcal{B}_{i,j} := BrepBoolOP(\partial V_C^i, \partial V_C^j, INT)$;
5:     $\mathcal{TV} := \mathcal{S}_{TV}(V_C^i) \cup \mathcal{S}_{TV}(V_C^j)$;
6:     $\mathcal{V}_{Cells} := \mathcal{V}_{Cells} \cup \{C_{V_C}(\mathcal{B}_{i,j}, \mathcal{TV})\}$;
7:   end for
8: end for
9: $V_M^{1 \cap 2} :=$ Glue all V-cells in $\mathcal{V}_{Cells}$;

← 1102

Algorithm 2 V-Subtract: Subtraction of two V-models

Input: V-models $V_M^1, V_M^2$;
Output: $V_M^{1 \setminus 2}$, V-model of the subtracting $V_M^2$ from $V_M^1$;
Algorithm:

1: $\mathcal{V}_{Cells} := \emptyset$;
2: $\mathcal{B}_2 := \partial V_M^2$;
3: for all $V_C^i \in \mathcal{S}_{V_C}(V_M^1)$ do
4:   $\mathcal{B}_i := BrepBoolOP(\partial V_C^i, \mathcal{B}_2, SUBTR)$;
5:   $\mathcal{V}_{Cells} := \mathcal{V}_{Cells} \cup \{C_{V_C}(\mathcal{B}_i, \mathcal{S}_{TV}(V_C^i))\}$;
6: end for
7: $V_M^{1 \setminus 2} :=$ Glue all V-cells in $\mathcal{V}_{Cells}$;

← 1104

Algorithm 3 V-Union: Union of two V-models

Input: V-models $V_M^1, V_M^2$;
Output: $V_M^{1 \cup 2}$, V-model of the union of $V_M^1$ and $V_M^2$;
Algorithm:

1: $V_M^{1 \cap 2} :=$ V-Intersect$(V_M^1, V_M^2)$;
2: $V_M^{1 \setminus 2} :=$ V-Subtract$(V_M^1, V_M^2)$;
3: $V_M^{2 \setminus 1} :=$ V-Subtract$(V_M^2, V_M^1)$;
4: $\mathcal{V}_{Cells} := \mathcal{S}_{V_C}(V_M^{1 \cap 2}) \cup \mathcal{S}_{V_C}(V_M^{1 \setminus 2}) \cup \mathcal{S}_{V_C}(V_M^{2 \setminus 1})$;
5: $V_M^{1 \cup 2} :=$ Glue all V-cells in $\mathcal{V}_{Cells}$;

SYSTEMS AND METHODS FOR GENERATING VOLUMETRIC MODELS

RELATED APPLICATIONS

This application is a National Phase of PCT Patent Application No. PCT/IL2017/050578 having International filing date of May 24, 2117, which claims the benefit of priority under 35 USC § 119(e) of U.S. Provisional Patent Application No. 62/340,556 filed on May 24, 2016. The contents of the above applications are all incorporated by reference as if fully set forth herein in their entirety.

FIELD AND BACKGROUND OF THE INVENTION

The present invention, in some embodiments thereof, relates to geometric objects and, more specifically, but not exclusively, to systems and methods for design and analysis of a geometric object.

The most common geometric representation of objects is the boundary representation (B-rep), where the object is delineated by its border surface(s). There are many methods to model the border surface(s), and the two most common basic building blocks for B-reps are Linear primitives such as triangles, quads, or general polygons, and Trimmed spline surfaces, as a set of piecewise polynomial or rational functions, over some parametric spaces. The Linear primitives method and the Trimmed spline surface method are commonly used in geometric modeling systems.

SUMMARY OF THE INVENTION

According to an aspect of some embodiments of the present invention there is provided a method of design and analysis of a geometric object comprising: receiving an initial definition of the geometric object in a coordinate system; generating a volumetric model according to the initial definition, the volumetric model comprises: volumetric cells each represented by at least one multivariate of three variables or more function, and intra object general border surfaces in general orientation each defines topological adjacency between at least two of the volumetric cells.

Optionally, the initial definition is received from a source selected from a group consisting of: a computer aided design (CAD) user interface (UI), a 3D scan, a CT scan, an MRI scan, a 3D scanner, a medical imaging device, a coordinate measuring machine (CMM), and an existing B-rep model.

Optionally, the multivariate of three variables or more function is a trimmed multivariate of three variables or more function.

Optionally, the multivariate of three variables or more function is a B-spline (trimmed) multivariate of three variables or more function.

Optionally, the volumetric model is a primitive shape selected from a group consisting of a box, a cylinder, a cone, a sphere, and a torus, or a basic model constructor selected from a group consisting of an extruded volume, a volume of revolution, a ruled volume, Boolean Sum, and a sweep volume. Optionally, the primitive shape is non-singular.

Optionally, the volumetric model is the result of a volumetric Boolean set operation (i.e., one of union, intersection, subtraction) between at least two simpler volumetric models.

Optionally, at least one of the volumetric cells is associated with at least one attribute field having a value defining an interior, constant, property of the geometric object.

Optionally, at least one attribute field having the value defining the interior of at least one volumetric cell is different from a value of an exterior property of the geometric object.

Optionally, at least one of the volumetric cells is associated with at least one attribute field having a value defining an interior, varying, property of the geometric object. Optionally, the at least one attribute field includes an indication of at least one material for manufacturing of the respective volumetric cell, wherein the geometric object is manufactured according to the at least one attribute field using manufacturing methods employing heterogeneous materials defined by the respective at least one material of respective volumetric cells. Alternatively or additionally, the at least one attribute comprises non-geometric datasets selected from the group consisting of: material properties, stress, stiffness, conductivity, resistance, inductivity, pressure, temperature, speed, accelerations, viscosity, forces, density, translucency, color, texture, and border properties.

Optionally, the method further comprises representing overlapping volumes of a volumetric Boolean set operation (i.e. one of a union, intersection or subtraction) of the geometric object and an additional geometric object having another volumetric model that comprises other volumetric cells by a volumetric Boolean set operation volumetric model that: includes new intra object general border surfaces at least some define topological adjacency between at least one of the volumetric cells and at least one of the other volumetric cells.

Optionally, the method further comprises representing overlapping volumes of a union, intersection or subtraction of the geometric object and an additional geometric object having another volumetric model that comprises other volumetric cells by new volumetric cells; wherein each of at least some of the new volumetric cells comprises at least one attribute field having a value defining an interior property of a cell of the union, intersection or subtraction, the value is calculated according to at least one blending function that combines values of the at least one attribute field from one of the volumetric cells and one of the other volumetric cells.

Optionally, a respective the intra object general border surface comprises a left sub intra object general border surface and a right sub intra object general border surface; wherein each of the left and right sub intra object general border surfaces is associated with a different volumetric cell from the volumetric cells.

Optionally, a respective the intra object general border surface is comprised of a first intra object general border surface and a second intra object general border surface of the same volumetric cell.

Optionally, each of the intra object general border surfaces defines a curved, trimmed, B-spline surface.

Optionally, the initial definition is an existing boundary B-rep model; wherein the volumetric model inherits at least geometric boundaries of the existing boundary B-rep model. Optionally, the initial definition comprises a constructive solid geometry (CSG) tree, wherein the volumetric model is created by mapping the CSG tree of the B-rep model to a CSG tree of the volumetric model.

Optionally, the method further comprises automatically updating interior and border properties of the volumetric model with an arbitrary desired continuity.

Optionally, at least one of the intra object general border surfaces comprises a trimmed surface, and further comprising: tiling a domain of the trimmed surface with mutually exclusive quads having freeform boundaries; parameterizing an interior of each respective quad using curves bounding the quad; constructing a set of tensor product patches that tiles and covers the trimmed surface; and integrating over the trimmed surface based on integrating over a set of the tensor product patches.

Optionally, the volumetric model comprises at least one of a volumetric curve and a volumetric point that each further defines the topological adjacency between at least two of the volumetric cells.

Optionally, the method further comprises processing a topological query applied to the volumetric model.

Optionally, the volumetric model comprises a 3D volumetric model.

Optionally, the intra object general border surfaces comprise trimmed surfaces.

According to an aspect of some embodiments of the present invention there is provided a system for design and analysis of a geometric object, the system comprising: a program store storing code; and a processor coupled to the program store for implementing the stored code, the code comprising: code to receive an initial definition of the geometric object in a coordinate system, and generate a volumetric model according to the initial definition, the model comprises volumetric cells each represented by at least one multivariate of three variables or more function, and intra object general border surfaces in general orientation each defines topological adjacency between at least two of the volumetric cells. Optionally, the volumetric model is integrated into code of an existing B-Rep modeler using an integration software interface.

According to an aspect of some embodiments of the present invention there is provided a computer program product comprising a non-transitory computer readable storage medium storing program code thereon for implementation by a processor of a system for design and analysis of a geometric object, comprising: instructions to receive an initial definition of the geometric object in a coordinate system; and instructions to generate a volumetric model according to the initial definition, the volumetric model comprises: volumetric cells each represented by at least one multivariate of three variables or more function, and intra object general border surfaces in general orientation each defines topological adjacency between at least two of the volumetric cells.

Unless otherwise defined, all technical and/or scientific terms used herein have the same meaning as commonly understood by one of ordinary skill in the art to which the invention pertains. Although methods and materials similar or equivalent to those described herein can be used in the practice or testing of embodiments of the invention, exemplary methods and/or materials are described below. In case of conflict, the patent specification, including definitions, will control. In addition, the materials, methods, and examples are illustrative only and are not intended to be necessarily limiting.

BRIEF DESCRIPTION OF THE SEVERAL VIEWS OF THE DRAWINGS

Some embodiments of the invention are herein described, by way of example only, with reference to the accompanying drawings. With specific reference now to the drawings in detail, it is stressed that the particulars shown are by way of example and for purposes of illustrative discussion of embodiments of the invention. In this regard, the description taken with the drawings makes apparent to those skilled in the art how embodiments of the invention may be practiced.

In the drawings:

FIG. 11 includes pseudocode of a method for performing an intersection, a subtraction, and a union of two volumetric models, in accordance with some embodiments of the present invention;

DETAILED DESCRIPTION

Figure 1:
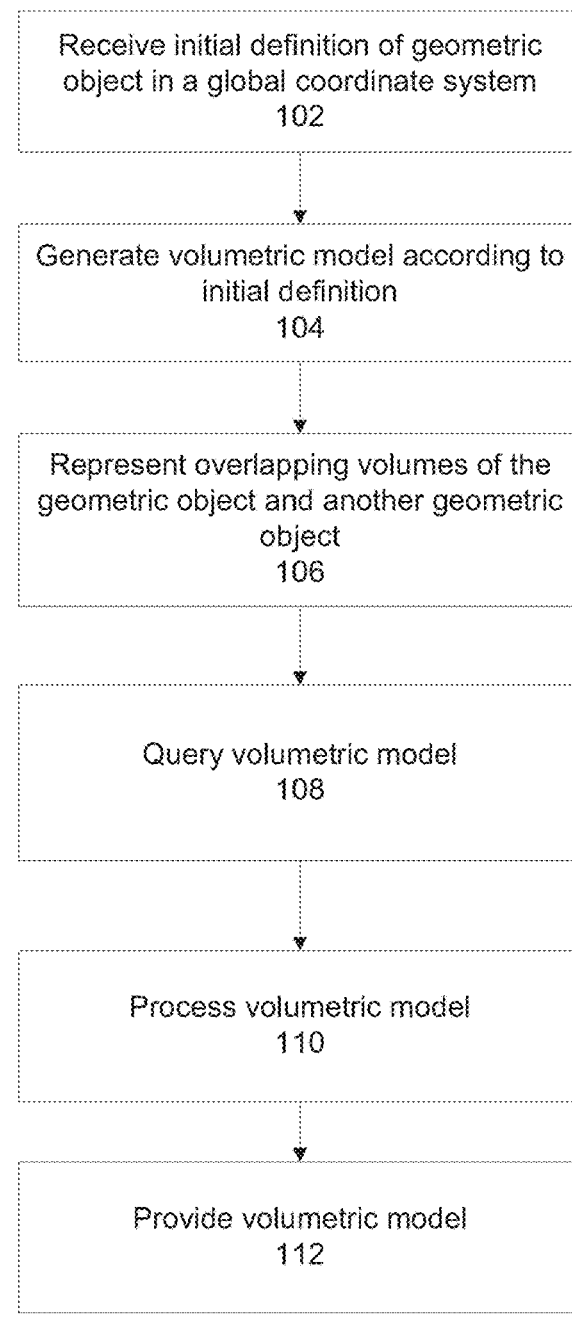
FIG. 1 is a flowchart of a method for generating a volumetric model according to an initial definition of a geometric object in a coordinate system, in accordance with some embodiments of the present invention.

The present invention, in some embodiments thereof, relates to geometric objects and, more specifically, but not exclusively, to systems and methods for design and analysis of a geometric object.

An aspect of some embodiments of the present invention relates to systems and/or methods for generating a volumetric model, optionally a three dimensional (3D) volumetric model or higher dimensions (e.g., including other attributes, for example, stress and/or temperature), according to an initial definition of a geometric objects in a coordinate system. The coordinate system may define the geometric object in terms of exterior boundaries and/or (optionally trimmed) surfaces. The generated volumetric model defines the geometric object according to the interior volume of the geometric object and the boundaries of the geometric object. The volumetric model includes volumetric cells each represented by multivariate of three variables or more function(s), and intra object general border (optionally trimmed) surfaces each defining a topological adjacency between two or more of the volumetric cells.

Optionally, the multivariate of three variables or more function is a trimmed multivariate of three variables or more function.

Alternatively or additionally, the multivariate of three variables or more function is a B-spline multivariate of three variables or more function. The multivariate function may be a trimmed B-spline trivariate function.

Optionally, at least some of the volumetric cells are associated with one or more attribute fields having value(s) defining an interior property of the geometric object which is different than a value of an exterior property of the geometric object, for example, as a scalar, vector, or tensor fields. Optionally, the attribute field(s) may include non-geometric datasets, for example, one or more of: material of the respective volumetric cell(s), material properties, stress, stiffness, conductivity, resistance, inductivity, pressure, temperature, speed, accelerations, viscosity, forces, density, translucency, color, texture, and border properties. The attribute field(s) may define border conditions, for example, pressure.

Optionally, the volumetric model is created from non-singular primitive shapes, for example, a box, a cone, a cylinder, a torus, and a sphere. Alternatively or additionally the volumetric model is created using a basic 3D model constructor, for example, a ruled volume, a volume of resolution, and a sweep volume.

Optionally, Boolean operations (i.e., union, intersection, and subtraction) are performed on volumetric cells of two or more volumetric models. New volumetric cells may be created based on the Boolean operation. Optionally, attributes associated with volumetric cells of each of the volumetric properties are blended by a blending function in the overlapping volumetric cells. The newly blended attribute values are assigned to the new volumetric cells.

Optionally, the volumetric model is created by migrating an existing boundary B-rep model (that defines the initial definition of the geometric object). The volumetric model inherits at least the geometric boundaries of the existing boundary B-rep model. The migration may be performed by mapping a constructive solid geometry (CSG) tree calculated for the existing boundary B-rep model to a CSG tree of the volumetric model.

The systems and/or methods described herein provide a technical solution to the technical problem of representing a geometric object for analysis and/or manufacturing. The systems and/or methods described herein may provide a single geometric representation that may be used for both the design phase and the analysis phase of the modeling cycle, which avoids conversion from one design format to another analysis format. The generated volumetric model (as described herein) includes details of the interior of the object, in addition to the boundaries, allowing, for example, manufacturing using heterogeneous materials (multivariate(s) in a cell may describe varying materials) using manufacturing methods, for example, additive manufacturing (AM) methods. The generated volumetric model may be analyzed, for example, using iso-geometric analysis (IGA) methods. Existing boundary representations (B-rep) data created by existing geometric model systems may be simply migrated to generate the volumetric model.

The systems and/or methods described herein improve performance of a computer (e.g., improvement in processor and/or memory utilization) such a client terminal and/or server, by reducing the processing and/or memory resources for performing an analysis and/or simulation of the geometric objects, and/or improving the accuracy of the analysis and/or simulation of the geometric object using existing resources, for example, in comparison to traditional finite element analysis (FEA) processes that require the conversion of 3D B-rep data (e.g., mechanical parts) to a representation in which the physical simulation may be performed. In such methods, grids or meshes, based on piecewise linear approximating primitives (e.g., triangles, tetrahedral, quadrilaterals, and hexahedra) are usually used to represent the geometric object for analysis. Since such existing methods are merely piecewise linear discrete approximations of the real freeform models, such analysis methods suffer from numerical instability and/or relatively low accuracy. Moreover, using such existing methods, the process of generating a discrete approximated mesh for analysis from a given 3D B-rep CAD model is a time consuming step in performing finite element analysis (FEA) on the model, estimated to consume up to 80% of the overall design and analysis process. It is noted that isogeometric analysis (IGA) methods are mostly applied in the 2D case due to lack of suitable geometric representations and tools for handling volumetric objects. Moreover, the accuracy of the computer is improved by applying the computational resources (e.g., processor(s), memory) for performing computations by utilizing the volumetric model, for example by using one or more of the following methods (described herein in additional detail): integration over an intra object general border (optionally trimmed) surface of one or more volumetric cells of the volumetric model, projection of curves and/or points on the volumetric model, and/or performing a contact and/or maximal penetration depth analysis on the volumetric model.

The systems and/or methods described herein improve performance of existing geometric modeling systems (e.g., CAD based systems) by converting from an initial definition of the geometric object in a coordinate system (e.g., a B-rep model designed using a CAD system) to the volumetric model described herein.

The systems and/or methods described herein improve performance of an additive manufacturing device, by defining internal volumes that may be used to manufacture (optionally heterogeneous) porous structures, and/or by accurately (e.g., improved resolution) defining the interior of the geometric object, allowing for manufacturing of highly precise objects. The volumetric model described herein may be used to represent complex shapes, and/or to perform Boolean operations on the complex shapes. Moreover, the systems and/or methods described herein may handle trimmed volumes, and support the current modeling space of B-reps (common in contemporary modeling systems). The systems and/or methods described herein provide a general method for handling Boolean operations over volumes. The volumetric model (e.g., trimmed volume representation) provides a richer modeling space as compared to, for example, tensor produce B-spline trivariates that can only represent shapes likes cubes while even for cylinders, spheres, and cones, the tensor product trivariates introduces singularities. Currently existing (B-rep) geometric modeling systems offers a small set of (optionally trimmed) surface constructors, such as basic (optionally trimmed) surface primitives (e.g., a cone), ruled (optionally trimmed) surfaces and (optionally trimmed) surfaces of revolution, as well as Boolean operations over B-rep elements.

The systems and/or methods described herein improve performance of a computer (e.g., in terms of accuracy and/or processing resources) and/or improve performance of a manufacturing system, such as an additive manufacturing device, by improving the accuracy of the represented geometric object. The high accuracy provided by the generated volumetric model described herein is obtained with relatively lower memory requirements and/or relatively lower processing requirements, for example in comparison to other methods, such as voxel based representation. Voxel based approaches suffer from lack of accuracy and huge data storage requirements. For example, a CT scan from a typical device generates a volume of 512 voxels in each dimension (based on a 2 millimeter accuracy for an object one meter wide), with each voxel represented using a typical 16 bit. Such a volume requires around 256 Megabytes of storage space. Moreover, voxels cannot be used for accurate manufacturing, since the amount of expected storage space becomes huge with increased accuracy, for example, the accuracy offered by subtractive manufacturing (SM) technologies (e.g., CNC) is in the orders of microns and tens of microns, which would require very large storage space using voxel based methods, for the same (about one meter) sized objects.

The systems and/or methods described herein improve performance of implantable medical devices, for example, improving micro-scale bone scaffold design to create patient specific porous structures to replace unhealthy or diseased tissue.

Accordingly, the systems and/or methods described herein are inextricably tied to computer technology to overcome an actual technical problem arising in representation of geometric objects, and/or are inextricably tied to manufacturing technology to overcome an actual technical problem arising in design, analysis, and manufacturing of geometric objects.

Before explaining at least one embodiment of the invention in detail, it is to be understood that the invention is not necessarily limited in its application to the details of construction and the arrangement of the components and/or methods set forth in the following description and/or illustrated in the drawings and/or the Examples. The invention is capable of other embodiments or of being practiced or carried out in various ways.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

As used herein, the term value used in association with volumetric cell(s) means optionally varying value(s), since the volumetric cell(s) may include varying properties (e.g., varying material specifications).

As used herein, the term mulvariate function refers to a multivariate of three (3) variables or more function.

As used herein, the term general and general orientation refers to general trimming, to clarify the difference over other methods, for example, division along isoparametric directions (e.g., performed by other methods).

Applicants realized that volumetric representation is lacking in existing geometric modeling systems that represent geometric objects according to the boundaries of the objects. The geometric object boundaries in existing geometric system are usually represented as a set of tensor product (e.g., trimmed) surfaces. The (optionally trimmed) surfaces define the 2-manifold boundaries of the geometric object. The volume of the object is delineated based on the 2-maniformd boundaries. Applicants discovered that the generated volumetric model of the initial definition of the geometric object (as described herein) may be used to improve the field of advanced manufacturing technologies employing heterogeneous materials, for example, additive manufacturing (also termed 3D printing) using functionally graded materials.

The systems and/or methods described herein, based on the described volumetric model, address technical challenges that are not solved by other methods. For example, other methods do not handle trimmed volumes, and are not general enough to support modeling space of B-reps (which is used by some existing modeling systems). Moreover, other methods do not provide a general method for handling Boolean operations over volumes. For example:

Aigner, M., Heinrich, C., Juttler, B., Pilgerstorfer, E., Simeon, B., Vuong, A.-V., 2009. Swept volume parameterization for isogeometric analysis, Springer, appears to relate to an algorithm for calculating a tensor product trivariate from border conditions and guiding curves. However, the method is designed to handle only swept volume structures.

Liu, L., Zhang, Y., Hughes, T. J., Scott, M. A., Sederberg, T. W., 2014. Volumetric t-spline construction using boolean operations. Engineering with Computers 30 (4), 425-439 appears to relate to Boolean operation of volumetric cylinders and cubes with hierarchical octrees to extract T-spline trivariates from border triangulated (optionally trimmed) surfaces. However, the described method cannot handle more complex shapes, even as simple as cones and tetrahedron.

Kumar, V., Burns, D., Dutta, D., Ho_mann, C., 1999. A framework for object modeling. Computer-Aided Design 31 (9), 541-556. Kumar, V., Dutta, D., 1997. An approach to modeling multi-material objects. In: Proceedings of the fourth ACM symposium on Solid modeling and applications. ACM, pp. 336-345, and Kumar, V., Dutta, D., 1998. An approach to modeling & representation of heterogeneous objects. Journal of Mechanical Design 120 (4), 659-667 appears to relate to a framework for segmenting a geometric object into cells by using constructive solid geometry (CSG) operations, where each cell describes both the geometry and material properties. However, the described method uses a limited set of basic shapes (and CSG operations) such as spheres and cubes, and therefore is unable to handle complex general freeform objects.

Martin, T., Cohen, E., Kirby, R., 2009. Volumetric parameterization and trivariate b-spline fitting using harmonic functions. Computer Aided Geometric Design 26 (6), 648-664, solid and Physical Modeling 2008ACM Symposium on Solid and Physical Modeling and Applications, and Martin, W., Cohen, E., 2001. Representation and extraction of volumetric attributes using trivariate splines: A mathematical framework. In: Proceedings of the Sixth ACM Symposium on Solid Modeling and Applications. SMA '01. ACM, New York, N.Y., USA, pp. 234-240 appears to relate to modeling attributes as separate trivariate volumes that are not coupled to the geometry, but share the same parametric domain. However, the method supports only complete (non-trimmed) tensor product trivariates.

Biswas, A., Fenves, S. J., Shapiro, V., Sriram, R., 2008. Representation of heterogeneous material properties in the core product model. Engineering with Computers 24 (1), 43-58 appears to relate to a high level abstract model for the representation of heterogeneous objects, that are composed of geometry and continuously varying materials. However, Biswas et al. does not teach or relate to trimmed domain. Moreover, the described extension toward heterogeneous materials is based on a distance function from interior or border geometric curves or points defining the material attributes, called features positions. It is noted that the described volumetric representation may be implemented in addition to the described extension.

Chen, J., Shapiro, V., 2008. Optimization of continuous heterogeneous models. In: Heterogeneous objects modelling and applications. Springer, pp. 193-213 appears to relate to a framework for representing and optimizing volumetric heterogeneous models. The geometry of the model is represented by implicit functions and the material distribution using a linear combination of B-spline basis functions. However, both representations are defined over the same spatial domain, where only locations inside the model are considered.

The volumetric model described herein includes multiple volumetric cells, each of which may have a different independent geometry and optional associated, optionally varying (and/or optionally constant), attribute(s), providing for control and/or definition of heterogeneity of the volumetric model, which address the technical problems described herein. For example, each volumetric cell may have a varying or a constant attribute value, which may be different than the attribute value of other volumetric cells.

Figure 2:
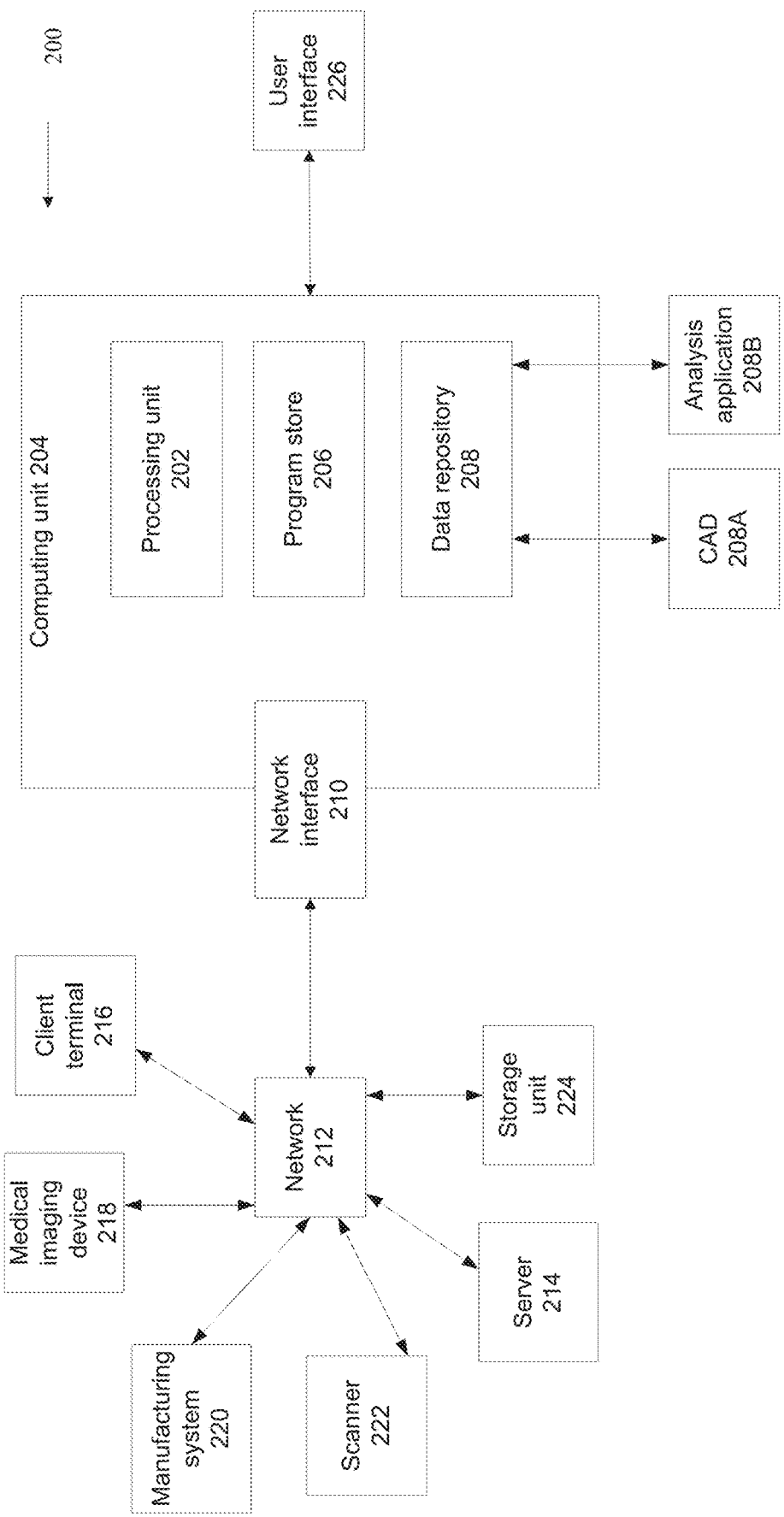
FIG. 2 is a block diagram of a system that generates a volumetric model according to an initial definition of a geometric object in a coordinate system, in accordance with some embodiments of the present invention.

Reference is now made to FIG. 1, which is a flowchart of a method for generating a volumetric model according to an initial definition of a geometric object in a coordinate system, in accordance with some embodiments of the present invention. Reference is also made to FIG. 2, which is a block diagram of a system 200 that generates a volumetric model according to an initial definition of a geometric object in a coordinate system, in accordance with some embodiments of the present invention. The volumetric model may be analyzed and/or used for manufacturing of the geometric object, optionally using additive manufacturing systems. System 200 may execute the acts of the method described with reference to FIG. 1, for example, by a processing unit 202 of a computing unit 204 executing code instructions stored in a program store 206.

Computing unit 204 may be implemented as, for example, a client terminal, a server, a mobile device, a desktop computer, a thin client, a Smartphone, a Tablet computer, a laptop computer, a wearable computer, glasses computer, and a watch computer. Computing unit 204 may include locally stored software that performed one or more of the acts described with reference to FIG. 1, and/or may act as one or more servers (e.g., network server, web server, a computing cloud) that provides services (e.g., one or more of the acts described with reference to FIG. 1) to one or more client terminals, for example, providing software as a service (SaaS) to the client terminal(s), providing an application for local download to the client terminal(s), and/or providing functions using a remote access session to the client terminals, such as through a web browser.

Processing unit 202 may be implemented, for example, as a central processing unit(s) (CPU), a graphics processing unit(s) (GPU), field programmable gate array(s) (FPGA), digital signal processor(s) (DSP), and application specific integrated circuit(s) (ASIC). Processing unit(s) 202 may include one or more processors (homogenous or heterogeneous), which may be arranged for parallel processing, as clusters and/or as one or more multi core processing units.

Program store 206 stores code instructions implementable by processing unit 206, for example, a random access memory (RAM), read-only memory (ROM), and/or a storage device, for example, non-volatile memory, magnetic media, semiconductor memory devices, hard drive, removable storage, and optical media (e.g., DVD, CD-ROM).

Computing unit 204 may include a data repository 208 for storing data, for example, a computer aided design (CAD) user interface (UI) 208A for use by a user to design the geometric object, and/or an analysis application 208B that performs simulations using the geometric object and/or analysis the geometric object (e.g., structural analysis, stress and/or strain analysis, fatigue analysis). Data repository 208 may be implemented as, for example, a memory, a local hard-drive, a removable storage unit, an optical disk, a storage device, and/or as a remote server and/or computing cloud (e.g., accessed using a network connection).

Computing unit 204 may include a network interface 210 for connecting to a network 212, for example, one or more of, a network interface card, a wireless interface to connect to a wireless network, a physical interface for connecting to a cable for network connectivity, a virtual interface implemented in software, network communication software providing higher layers of network connectivity, and/or other implementations.

Computing unit 204 may access one or more remote servers 214 using network 212, for example, to download the initial definition of the geometric object, and/or to provide the generated volumetric model.

Computing unit 204 may connect using network 212 (or another communication channel, such as through a direct link (e.g., cable, wireless) and/or indirect link (e.g., via an intermediary computing unit such as a server, and/or via a storage device) with one or more of:

Client terminal 216, for example, when computing unit 204 acts as a server providing SaaS.

A medical imaging modality device 218 that outputs imaging data that may be used to create the initial definition of the geometric object in the coordinate system (as described herein), for example, a computerized tomography (CT) scan of a patient, a magnetic resonance imaging (MRI) scan of the patient, and/or based on other imaging methods.

A manufacturing system 220 that manufactures the geometric object based on the generated volumetric model, for example, an additive manufacturing unit.

A 3D scanner 222 that performs a 3D scan of the geometric object and outputs imaging data that may be used to create the initial definition of the geometric object in the coordinate system. The geometric object may be adapted and/or analyzed using the volumetric model. An improved version of the geometric object may be manufactured based on the volumetric model.

A storage unit 224 that stores the initial definition of the geometric object (e.g., provided by client terminal 216, medical imaging device 218, server 214, scanner 222, and/or used by computing unit 204 for remote storage) and/or the generated volumetric model (e.g., created by computing unit 204 for use, for example, by manufacturing system 220 for manufacturing the volumetric object, and/or use by client terminal 216 for analysis of the volumetric model, and/or other computing units). Storage unit 224 may include, for example, a storage server, a computing cloud storage server, or other implementations.

Computing unit 204 includes or is in communication with a user interface 226 allowing a user to enter data and/or view presented data. Exemplary user interfaces 226 include, for example, one or more of, a touchscreen, a display, a keyboard, a mouse, and voice activated software using speakers and microphone.

Referring now back to FIG. 1, at 102, an initial definition of a geometric object in a coordinate system is received by computing unit 204. The initial definition may be stored, for example, as a file in data repository 208.

The initial definition may be received, for example, from CAD UI 208A (or provided by a remote client terminal 216 and/or server 214) as a CAD file (or other storage format implementations), 3D scanner 222 as a 3D scan, a scan performed by a coordinate measuring machine (CMM), and/or from medical imaging device 218 (optionally as a 3D scan), for example, as a CT scan, an ultrasound scan (e.g., 3D ultrasound), a PET-CT scan, and/or an MRI scan (e.g., stored as imaging data).

Optionally, the initial definition is an existing boundary B-rep model. The existing boundary B-rep model may be created using existing design applications, for example, CAD 208A or other design packages. The B-rep model is migrated to create the volumetric model described herein.

The volumetric model may be migrated from the initial definition of the geometric object created using constructive solid geometry (CSG) which may be used in B-rep modeling. A CSG object represented by a binary tree (i.e., CSG tree) of a B-rep freeform model may be mapped (e.g., almost directly) to a CSG tree of the volumetric model. The CSG of the volumetric model may be represented based on the primitives shapes (e.g., as described herein) and the basic model constructors (e.g., as described herein) using the Boolean operations (e.g., as described herein).

When the geometric object is represented in a coordinate system, for example, a B-rep model represented in a geometric modeling system, the CSG tree may be determined, for example, calculated based on the history of the geometric object and/or obtained from storage. The volumetric model may be created by mapping the leaves and the internal CSG operations from the B-rep used for the coordinate system to the volumetric model representation described herein.

Figure 14:
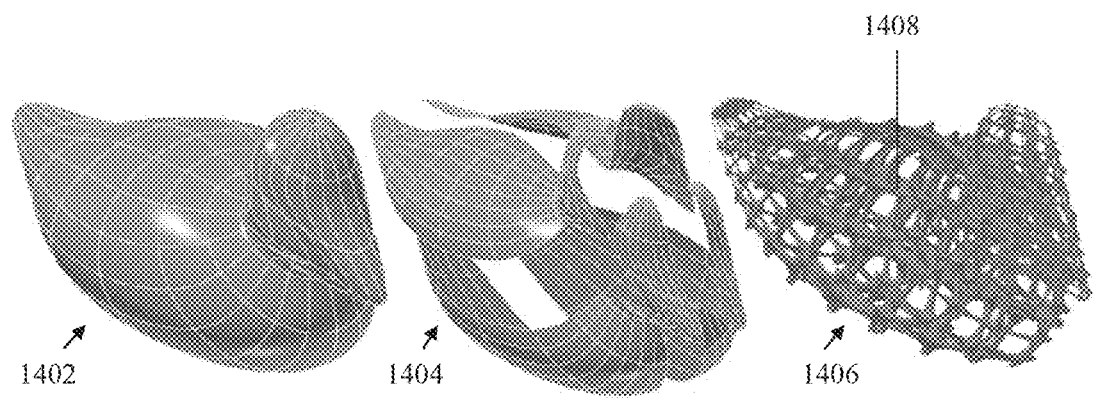
FIG. 14 is a schematic depicting a swept (optionally trimmed) surface converted to a volumetric model, in accordance with some embodiments of the present invention.

Reference is now made to FIG. 14, which is a schematic depicting a swept (optionally trimmed) surface 1402 converted 1404 to a volumetric model 1406, in accordance with some embodiments of the present invention. Schematic 1402 depicts a B-spline swept (optionally trimmed) surface in the shape of a duck. Schematic 1402 is automatically converted to volumetric model 1406 using a volumetric Boolean Sum operation, by dividing (optionally trimmed) surface 1402 into four strips along the sweep, and adding two cap (optionally trimmed) surfaces at the beginning and end of the sweep, defining the six (optionally trimmed) surfaces needed for the volumetric Boolean Sum, represented as intermediate schematic 1404. Schematic 1406 depicts (optionally trimmed) surface trivariate composition used to tile the constructed trivariate duck with porous elements. The porous construction represents another possible application of volumetric models (i.e., construction of porous geometry). A single tile 1408 of 3D volumetric model 1406 is shown as an example.

Referring now back to FIG. 1, at 104, a volumetric model, optionally a 3D volumetric model, is generated according to the initial definition. The volumetric model includes volumetric cells each represented by one or more multivariate functions (which described the interior geometric of the volumetric model), and intra object general border (optionally trimmed) surfaces each defining topological adjacency between two or more of the volumetric cells (which described the (optionally trimmed) surface of the volumetric model). The volumetric model may be stored using a suitable data structure implementation, for example, an object, a record, a database entry, a set of values associated with one or more functions, and a file.

The volumetric model may store topological information (e.g., in a suitable data structure) relating to shared common intra object general border (optionally trimmed) surfaces, common volumetric border curves, and common border points between adjacent volumetric cells of the volumetric model.

The multivariate function may be a trimmed multivariate function and/or a B-spline multivariate function, for example a trimmed B-spline trivariate function. The multivariate function may be used as a basic volumetric building block. The use of the multivariate function as a basic building block allows performing design, analysis (e.g., iso-geometric analysis), and manufacturing (e.g., additive manufacturing) using the common volumetric model.

The topological adjacency information stored by the volumetric model allows for efficient local updates, and performing domain composition analysis (e.g., as described by Toselli, A., Widlund, O. B., 2004. Domain Decomposition Methods :Algorithms and Theory. Vol. 34 of Computational Mathematics. Springer Verlag) where border conditions and constrains between volumetric cells, over intra object general border (optionally trimmed) surfaces are imposed.

Optionally, when the initial definition is an existing boundary B-rep model, the volumetric model inherits at least the geometric boundaries of the existing boundary B-rep model. Existing B-rep models (e.g., modeling tools, algorithms, data) may be migrated seamlessly and/or precisely to the volumetric model representation.

Optionally, at least some of the volumetric cells are associated with one or more attribute fields. The attribute fields are associated with a, optionally varying, value defining an interior property of the geometric object which is optionally different from a value of an exterior property of the geometric object. The attribute field may represent non-geometric dataset, for example, one or more of: material properties, stress field, conductivity, pressure, and border properties. The attribute field may include an indication of material(s) for manufacturing of the respective volumetric cell. The geometric object may be manufactured using the materials defined by the attribute field using additive manufacturing (AM) methods employing heterogeneous materials defined by the respective at least one material of respective volumetric cells.

Attribute field(s) may be associated with one or more of: the multivariate functions (e.g., trivariates and/or control points of the trivariates), volumetric cells, intra object volumetric border (optionally trimmed) surfaces, volumetric border curves and volumetric border points, optionally as border conditions. Attribute fields may be assigned to boundaries of the volumetric model, e.g., as border conditions in IGA. Attribute fields may be assigned to boundaries of volumetric cells, for example, in domain decomposition analysis, as well as the interior of volumetric cells, setting interior desired properties at certain locations. Each volumetric cell may encapsulate a set of attribute fields with certain continuity requirements with its neighboring volumetric cells. Independent constraints may be prescribed in the interior of the volumetric model, and manipulated, for example, as described by Biswas, A., Fenves, S. J., Shapiro, V., Sriram, R., 2008. Representation of heterogeneous material properties in the core product model. Engineeringwith Computers 24 (1), 43-58.

The B-spline trivariate represents a volumetric extension to parametric B-spline curves and (optionally trimmed) surfaces, in a parametric space. The trivariate may be represented by tensor product B-splines, based on the relationship:

$$F(u, v, w) = \sum_{i=0}^{l}\sum_{j=0}^{m}\sum_{k=0}^{n} P_{i,j,k} B_{i,d_u}(u) B_{j,d_v}(v) B_{k,d_w}(w), \quad \text{Equation (1)}$$

where F is defined over the parametric domain [Umin, Umax]×[Vmin, Vmax]×[Wmin,Wmax), and where Pi,j,k ∈ $\mathbb{R}^q$, q≥3 denote the control points of F and Bi,d is the i' th univariate B-spline basis functions of degree d.

Pi,j,k ∈ $\mathbb{R}^q$, q≥3 where the first three coordinates represent the geometry but optionally also additional attributes, such as a color or a stress tensor field, for q≥3. The scalar components of the different attribute fields may be encoded into the q≥3 coefficients of the Pi,j,k's, the control points of F(u,v,w). An alternative defines the attribute fields as additional trivariates alongside F(u,v,w) while sharing the same parametric domain, and parameterization.

The volumetric cell may be defined as a trimmed (optionally B-spline) trivariate volumetric cell, to represent general volumetric shapes other than a cuboid topology (which is defined by the B-spline trivariate without trimming).

The volumetric cell may be contained in multiple trimmed (optionally B-spline) trivariates, when the trivariates contain the volume in the volumetric cell. The trimming of a volumetric cell is defined by a set of trimming (bivariate, optionally B-spline) (optionally trimmed) surfaces in the domain of the trivariate(s). Each trimming surface may be trimmed by trimming (optionally B-spline) curves.

The volumetric model may be represented as a 3-manifold regular geometry, with the border (closure) of the volumetric model is a 2-manifold.

The volumetric cell may be represented as a 3-manifold in the intersection of one or more (optionally B-spline) tensor product trivariates. The sub-domain of the intersection may be delineated by trimming surfaces. A volumetric cell defines a unique volumetric zone inside the volumetric model. The volumetric cell is fully contained in all its tensor product trivariates within the volumetric model. The volumetric model may be represented as a complex of one or more (mutually exclusive) volumetric cells. Adjacent volumetric cells optionally share border (trimming) surfaces, curves or points.

The volumetric model may store topological information representing the 3-/2-/1-/0-manifold elements. The topological information may be used for traversing and updating the inner structures of the volumetric model, for example, in domain decomposition (e.g., as described by Toselli, A., Widlund, O. B., 2004. Domain Decomposition Methods: Algorithms and Theory. Vol. 34 of Computational Mathematics. Springer Verlag) toward analysis, where border conditions are propagated between volumetric cells. Each volumetric cell may be associated with one or more volumetric cell neighbors. Each pair of adjacent volumetric cells share one or more intra object general border surfaces (e.g., border trimming surfaces). The intra object surface may be a border trimming surface of one (or two or more adjacent) volumetric cells of a volumetric model. The intra object (optionally trimmed) surface is shared between two adjacent volumetric cells. The intra object (optionally trimmed) surface associated with a certain volumetric cell which is also an intra object general border (optionally trimmed) surface of the volumetric model.

The border of the volumetric model (denoted $V_M$) may be denoted as $\hat{o}V_M$, may be a closed B-rep 2-manifold defined as the union of the border intra object general border (optionally trimmed) surfaces in $V_M$(i.e., intra object general border (optionally trimmed) surfaces that are associated with one volumetric cell).

The defined topological information structure may be represented as a 3-manifold extension to a half edge data structure for representing regular graphs, for example, as described by McGuire, M., 2000, The half-edge data structure. Edges and faces are elevated a dimension and extended to intra object general border (optionally trimmed) surfaces and volumetric cells, respectively. The topology of the 2-manifold boundary B-rep is as described. Each intra object general border (optionally trimmed) surface is split into two sub intra object general border (optionally trimmed) surfaces.

A sub intra object general border surface represents an intra object general border (e.g., trimmed) surface of a single volumetric cell. Each intra object general border (optionally trimmed) surface is split into two sub intra object general border (optionally trimmed) surfaces with opposite orientation (having negated normal directions at the same point). A border intra object general border (optionally trimmed) surface is associated with only one sub intra object general border (optionally trimmed) surface. The sub intra object general border (optionally trimmed) surface holds references to: 1. The respective volumetric cell (e.g., the (optionally B-spline) trivariate the sub intra object general border surface is a border and/or trimming surface of). 2. The other sub intra object general border (optionally trimmed) surface of the neighboring volumetric cell (if exists). 3. Trimming loops in the parametric space of the (optionally trimmed) surface.

Optionally, a respective intra object general border (optionally trimmed) surface includes a left sub intra object general border (optionally trimmed) surface and a right sub intra object general border (optionally trimmed) surface. Each of the left and right sub intra object general border (optionally trimmed) surfaces is associated with a different volumetric cell from the volumetric cells of the volumetric model. It is noted that the terms left and right used herein are exemplary, and broadly represent opposing (optionally trimmed) surfaces, including cases in which the volumetric cells are in a different orientation with respect to each other, for example, a top volumetric cell and a bottom volumetric cell, or at an angle relative to a normal. Optionally, each of the intra object general border (optionally trimmed) surfaces defines a curved B- spline (optionally trimmed) surface. Alternatively or additionally, one (or more) trivariates and one (or more) volumetric cells that have two (or more) boundary (optionally trimmed) surfaces are glued together, for example a torus. In such a case, two boundary (optionally trimmed) surfaces of the same volumetric cell are glued.

Figure 3:
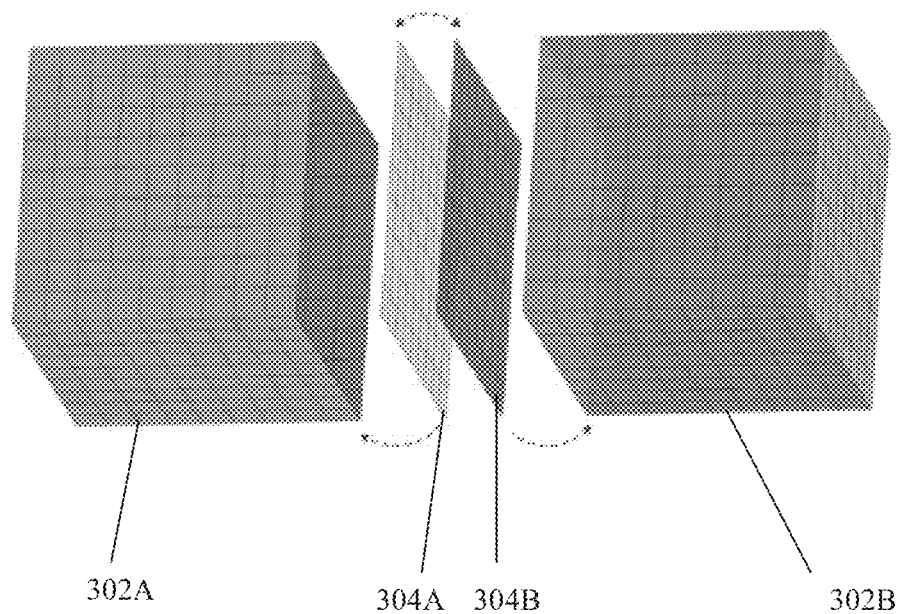
FIG. 3 is a schematic depicting two volumetric cells sharing an intra object general border (optionally trimmed) surface that is split into two sub intra object general border (optionally trimmed) surfaces, in accordance with some embodiments of the present invention.

Reference is now made to FIG. 3, which is a schematic depicting two volumetric cells 302A-B sharing an intra object general border (optionally trimmed) surface that is split into two sub intra object general border (optionally trimmed) surfaces, a left sub intra object general border (optionally trimmed) surface 304A and a right sub intra object general border (optionally trimmed) surface 304B, in accordance with some embodiments of the present invention. Each sub intra object general border (optionally trimmed) surface 304A-B refers to its own volumetric cell and references the other neighboring sub intra object general border (optionally trimmed) surface.

Referring now back to FIG. 1, optionally, the volumetric model includes a component to represent the topology of border curves in 3-manifolds (which is relatively more complex than the topology of edges defined in 2-manifold sub edge data structures). The complexity arises since each border curve may be associated with one or more volumetric cells. The border curve may be shared between multiple (i.e., unbounded number of) volumetric cells. Alternatively or additionally, the border curve may be located on the border of the volumetric model, and hence sharing no other volumetric cell. The border curve stores a reference to the intra object general border (optionally trimmed) surface that shares the volumetric curve, and a reference to two end points of the volumetric curve of type volumetric point (as described herein).

Optionally, the volumetric model includes a volumetric point component of the topological data that represents the topology using end points of the border curves. The volumetric point represents an intersection point of the volumetric curves. The volumetric point may include multiple (e.g., unbounded number of) volumetric curves that start and/or end at the respective volumetric point.

When the initial definition of the geometric object is defined using a tensor product B-spline trivariate (or other multivariate function), the initial definition may be converted to the volumetric model representation that includes a cuboid topology represented one volumetric cell, six sub intra object general border (optionally trimmed) surfaces, twelve volumetric curves, and eight volumetric points. The trivariate may be explicitly prescribed, by providing the three (u, v, w) orders, the control mesh and the three knot sequences.

Alternatively or additionally, the trivariate (or other multivariate function) may be defined using high level constructors, for example, Bivariate (or other multivariate) constructors, for example, extrusion, ruled (optionally trimmed) surface, (optionally trimmed) surface of revolution and sweep (optionally trimmed) surface may be used in the trivariate case, for example, as described by Cohen, E., Riesenfeld, R., Elber, G., 2002. Geometric modeling with splines: An introduction. 2002. AK Peters Natick, MA, USA. One or more of the following exemplary basic volumetric model constructors may be used (it is noted that the trivariate is exemplary, other multivariate functions may be used):

1. Extruded volume: For a (optionally trimmed) surface S(u, v) and a vector V, an extruded trivariate T(u, v, w) is denoted as: T(u, v, w)=S (u, v)+Vw, where w ∈ [0, 1].

2. Ruled volume: For two (optionally trimmed) surfaces S1(u, v) and S2(u, v), a ruled trivariate T(u, v, w) is denoted as: T(u, v, w)=S1(u, v)(1−w)+S2(u, v)w, where w ∈ [0, 1].

3. Volume of revolution: For a (optionally trimmed) surface S(u, v), a trivariate of revolution T(u, v, w) is constructed by rotating S around some axis.

4. Boolean Sum: Given six (optionally trimmed) surfaces organized in a cuboid topology, a trivariate T is generated such that each such (optionally trimmed) surface is a border of T, for example, as described by Elber, G., Kim, Y.-J., Kim, M.-S., 2012. Volumetric boolean sum. Computer Aided Geometric Design 29 (7), 532-540, geometric Modeling and Processing 2012.

5. Volumetric sweep: A trivariate T is generated that interpolates or approximates an ordered list of (optionally trimmed) surfaces, Si(u, v), at different wi parameters, where wi ∈ [0, 1].

Figure 8:
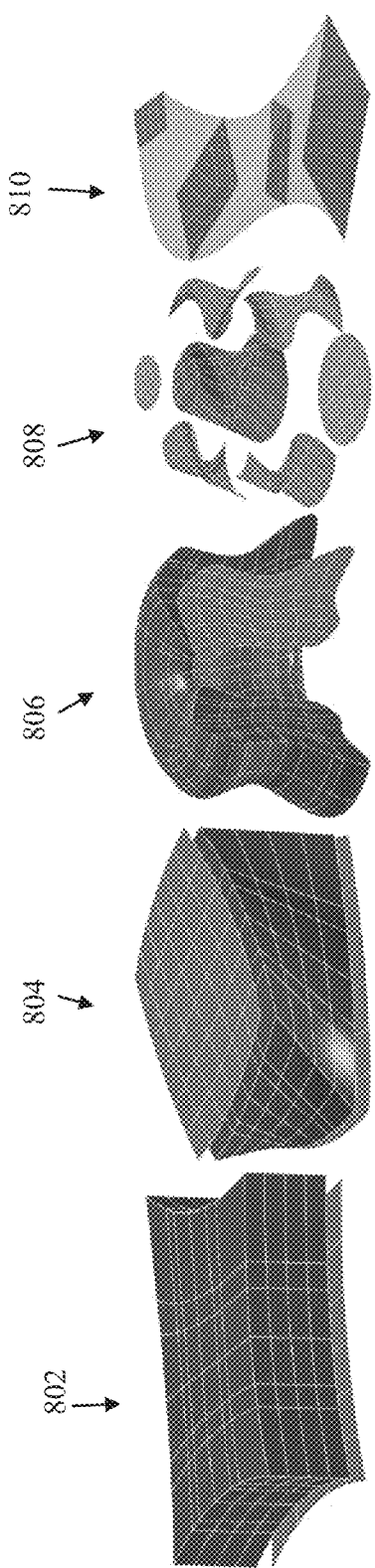
FIG. 8 is a schematic of exemplary basic volumetric models created using the exemplary constructors, in accordance with some embodiments of the present invention.

Reference is now made to FIG. 8, which is a schematic of exemplary basic volumetric models created using the exemplary constructors, in accordance with some embodiments of the present invention. Schematic 802 denotes a volume of extrusion. Schematic 804 denotes a ruled volume. Schematic 806 denotes a volume of revolution. Schematic 808 denotes a volumetric Boolean sum. Schematic 810 denotes a sweep volume. It is noted that the depicted constructors yield a single B-spline trivariate.

Referring now back to FIG. 1, alternatively or additionally, a set of primitive shapes (e.g., a set of constructors) that are composed of non-singular volumetric cells are provided (e.g., stored in data repository 208). Each volumetric cell is non-singular in its domain. At glued intra object general border (optionally trimmed) surface locations, the primitives are $C^0$ continuous.

Figure 9:
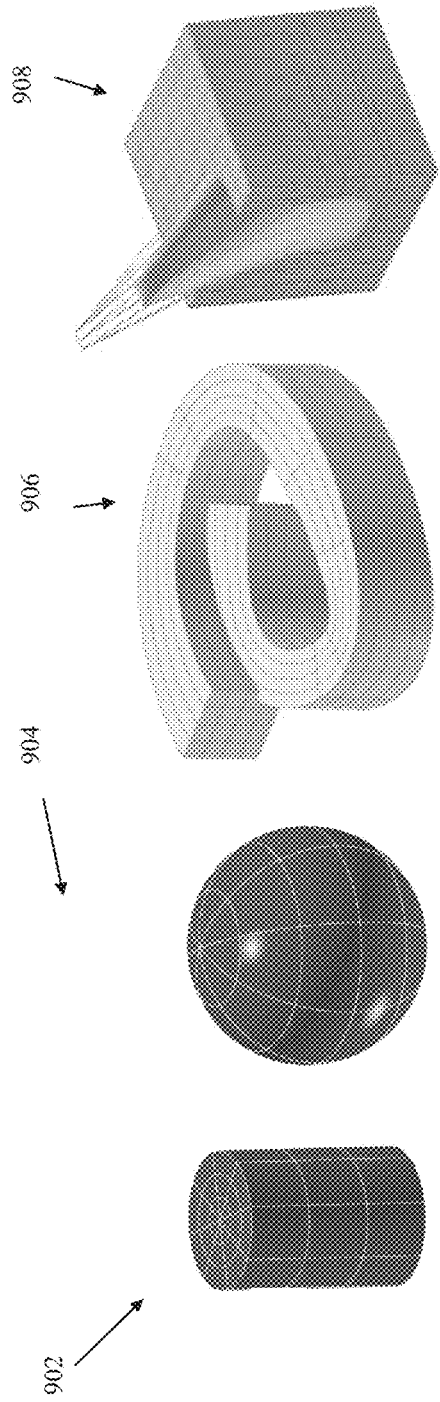
FIG. 9 is a schematic of an exemplary B-spline trivariate cylinder and a trivariate sphere that are singular along their respective central axis, useful for understanding some embodiments of the present invention.

The set of non-singular primitive shapes are provided to improve the efficiency of analysis. It is noted that singularities in the parametric domain are undesired. Primitive models, for example, spheres, cylinders, tori, and cones cannot be represented as tensor product B-spline trivariates without introducing singularities, where the normal (and the Jacobian of the mapping) vanishes. Reference is now made to FIG. 9, which is a schematic of objects that are singular, useful for understanding some embodiments of the present invention. Object 902 depicts an exemplary B-spline trivariate cylinder, and object 904 depicts a trivariate sphere, that are singular along their respective central axis. Object 906 depicts a singular self-intersecting B-spline trivariate. Object 908 depicts a singular cuboid B-split trivariate where three internal control points are moved up and outside the cuboid, resulting in a zone of negative Jacobian. It is noted that the border of trivariate object 908 no longer consists of only the six border (optionally trimmed) surfaces.

Figure 10:
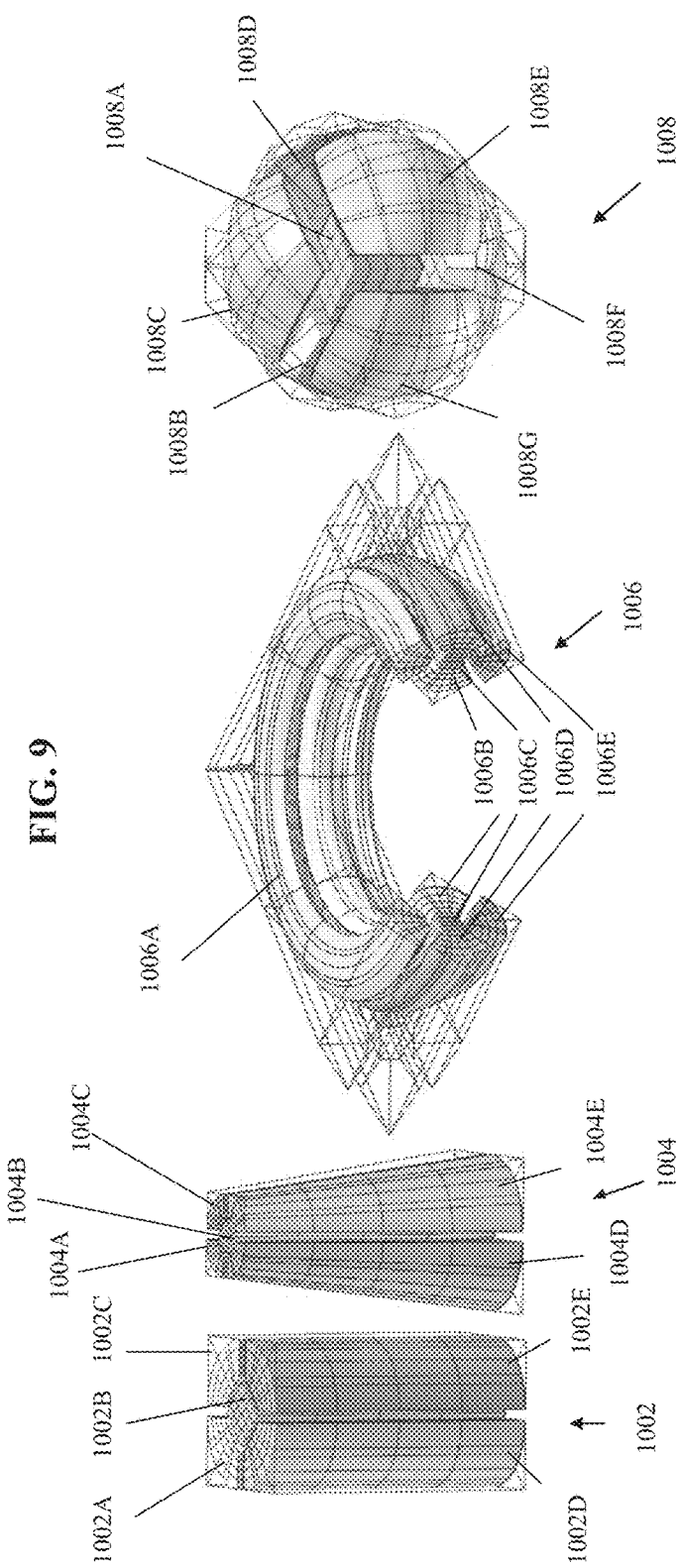
FIG. 10 is a schematic of exemplary primitive shapes for construction of the volumetric model, in accordance with some embodiments of the present invention.

Reference is now made to FIG. 10, which is a schematic of exemplary non-singular primitive shapes for construction of the volumetric model, in accordance with some embodiments of the present invention. In contrast with the shapes of FIG. 9, the shapes of FIG. 10 are non-singular. The primitive shapes may be constructed using the constructors described herein. Each primitive shape is constructed from multiple volumetric cells. The volumetric cells are glued together (e.g., using a Boolean union operation) along shared intra object general border (optionally trimmed) surfaces to create the primitive volumetric model shape. The primitive shapes are shown with the control meshes of the trivariates. Cylinder 1002 is composed using five volumetric cells 1002A-E constructed by extrusion. Cone 1004 is composed using five volumetric cells 1004A-E constructed by ruled volumes. Torus 1006 is composed using five volumetric cells 1006A-E constructed as volumes of revolution. Sphere 1008 is composed using seven volumetric cells, an internal cube volumetric cell 1008A, and six rounded volumetric cells 1008B-G around cube 1008A. Each of volumetric cells 1008B-G is constructed as a ruled volume between a cube face and a sixth portion of a tensor product B-spline sphere (optionally trimmed) surface, for example, as described with reference to Cobb, J. E., 1988. Tiling the sphere with rational b'ezier patches. In: Report TR UUCS -88-009. University of Utah, USA.

Referring now back to FIG. 1, optionally, at 106, a Boolean operation is performed on one or more volumetric models, and/or one or more volumetric cells. The volumetric model may be created from two or more volumetric models (each of which including one or more volumetric cells) that are glued together and/or by performing a union operation on two or more volumetric models.

Optionally, the volumetric model is the result of a volumetric Boolean set operation (i.e., union, intersection, subtraction) or gluing operation (i.e., connection at external (optionally trimmed) surface) between two or more simpler volumetric models, each of which includes one or more volumetric cells. The gluing operation on a set of volumetric cells creates a new volumetric model that includes all the volumetric cells with topological adjacency information associated with the intra object general border (optionally trimmed) surfaces, volumetric curves, and volumetric points.

Figure 4:
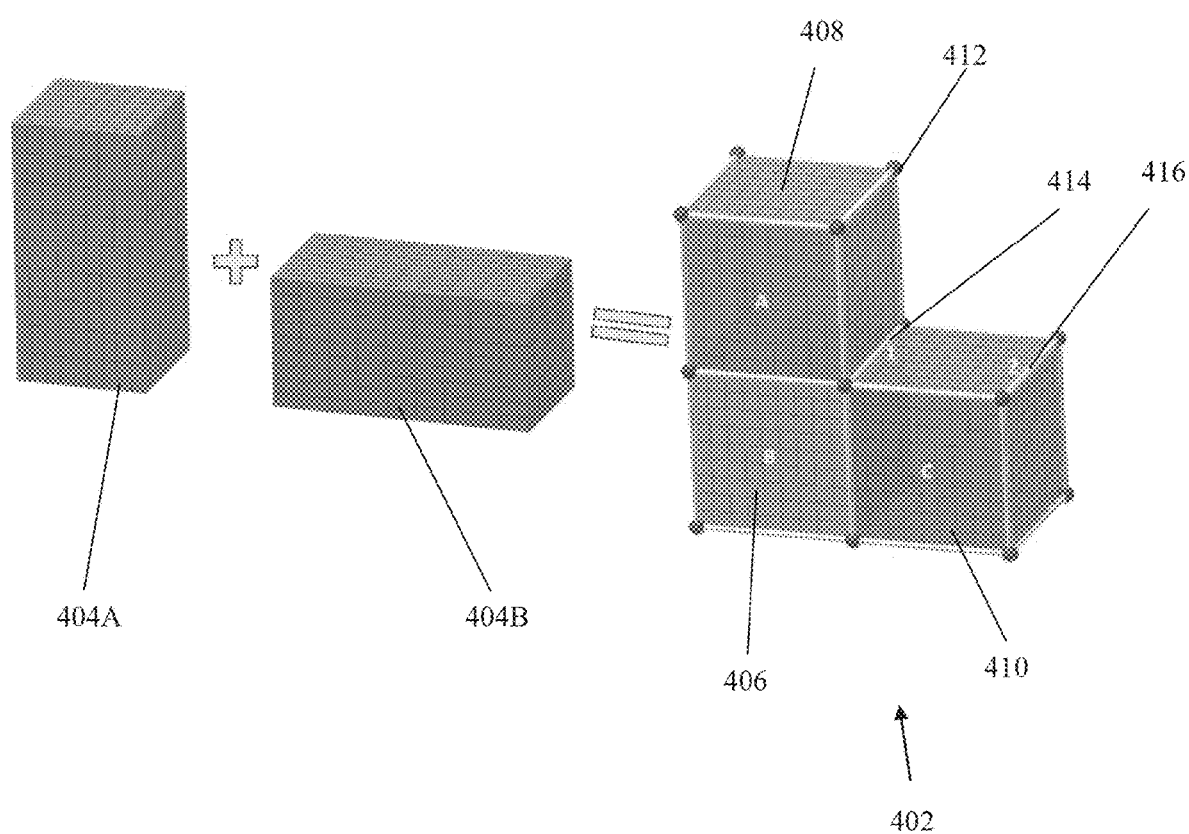
FIG. 4 is a schematic depicting creation of a volumetric model by performing a union operation on two simpler volumetric models, in accordance with some embodiments of the present invention.

Reference is now made to FIG. 4, which is a schematic depicting creation of a volumetric model 402 by performing a Boolean union operation on two simpler volumetric models 404A and 404B, in accordance with some embodiments of the present invention. Region 406 of the created volumetric model 402 represents the common volume between the simpler volumetric models 404A-B. Region 408 of the created volumetric model 402 represents the volume of the simpler volumetric models 404A (i.e., without a union with volumetric model 404B). Region 410 of the created volumetric model 402 represents the volume of the simpler volumetric model 404B. Since each region 406, 408, and 410 may be considered as a volumetric cell of volumetric model 402, or considered as a set of volumetric cells.

Regions 408 and 410 may represent one trivariate each from the original volumetric models 404A-B. Region 410 holds both trivariates from volumetric models 404A-B. Each volume cell 406, 408, and 410 includes 6 intra object general border surfaces (e.g., a sub intra object surface, optionally a trimming surface). There are two internal intra object general border (optionally trimmed) surfaces and 14 border intra object general border (optionally trimmed) surfaces. These intra object general border (optionally trimmed) surfaces are converted together to 18 sub intra object general border (optionally trimmed) surfaces. The intra object general border (optionally trimmed) surface between 408 and 406 is split into two sub intra object general border (optionally trimmed) surfaces Similarly, the intra object general border (optionally trimmed) surface between 406 and 410 is split into two sub intra object general border (optionally trimmed) surfaces. The volumetric model includes 16 volumetric points (one exemplar point 412 is marked for clarity), and 28 volumetric curves (two exemplary curves 414 and 416 are marked for clarity). Volumetric curve 414 stores information about the attached four intra object general border (optionally trimmed) surfaces (split into six sub intra object general border (optionally trimmed) surfaces), and stores information about two volumetric points located at the end points of curve 414. Volumetric curve 416 stores information about two intra object general border (optionally trimmed) surfaces (split into two sub intra object general border (optionally trimmed) surfaces). The volumetric points of volumetric curve 414 are attached to five volumetric curves each, and those of volumetric curve 416 are attached to three volumetric curves each.

Referring now back to FIG. 1, optionally, neighboring volumetric cells are glued together by comparing intra object general border (optionally trimmed) surfaces, volumetric curves, and/or volumetric points for similarity. The geometrical information (excluding attribute values) is considered when these similarities are examined. The comparison is performed according to the type of neighboring element:

Two volumetric points are considered the same if they designate the same 3-space location in Euclidean space.

Two volumetric curves are considered the same if their multivariate function (e.g., B-spline curves) are the same. For example, as described by Pekerman, D., Seong, J.-K., Elber, G., Kim, M.-S., 2005. Are two curves the same? Computer-Aided Design and Applications 2 (1-4), 85-94., two B-spline curves are the same if their control points are the same after reparametrization(s) (via compositions), if any, were eliminated and were elevated to the same function space via degree raising and knot insertion. The two volumetric curves may be brought to a common function space before any comparison of control points takes place. When the volumetric curves may be parameterized in reverse, the curves are also compared for similarity after one of the curves is reversed.

Two sub intra object general border (optionally trimmed) surfaces are considered the same if their multivariate function (e.g., B-spline surfaces, and/or trimming curves) are the same. Two B-spline (optionally trimmed) surfaces are the same if their control points are the same after the elimination of any reparametrization (via a composition), if was one, and elevated to the same function space via degree raising and knot insertion. The (optionally trimmed) surfaces may be brought to a common function space before comparison of the control points. When (optionally trimmed) surface S (u, v) may be parameterized by reversing u or v, or both, and u and v may be flipped to yield the same traced (optionally trimmed) surfaces, the (optionally trimmed) surfaces are compared following the reversal and/or flip operations of one of the (optionally trimmed) surfaces.

Optionally, the volumetric model is updated to represent overlapping volumes based on a volumetric Boolean set operation (one of: a union, intersection or subtraction) performed on the geometric object (e.g., the volumetric representation of the geometric object) and an additional geometric object having another model that includes other volumetric cells. The volumetric Boolean set operation updates the model to include new intra object general border (optionally trimmed) surfaces, at least some of which define topological adjacency between at least one of the volumetric cells and at least one of the other volumetric cells.

Alternatively or additionally, the volumetric model is updated to include new volumetric cells representing overlapping volumes of a union, intersection or subtraction of the geometric object (e.g., represented by the volumetric model) and an additional geometric object having another model that includes other volumetric cells. Each of at least some of the new volumetric cells are associated with one or more attribute fields having a value defining an interior property of the cell in the union, intersection or subtraction. The intersecting zones between the two volumetric models may be recreated as new volumetric cells that inherit the geometry and/or attributes from both models. The value of the respective attribute field is calculated according to one or more blending functions that combine values of respective attribute field(s) from volumetric cell(s) of the volumetric model and the other volumetric cells of the other model. Optionally, the blending function is applied when the new volumetric cell created by the Boolean operation inherits the same attribute field from different input volumetric cells. The blending function blends the values of the corresponding attribute fields of the volumetric cells. Optionally, the blending function is evaluated by demand.

Figure 5:
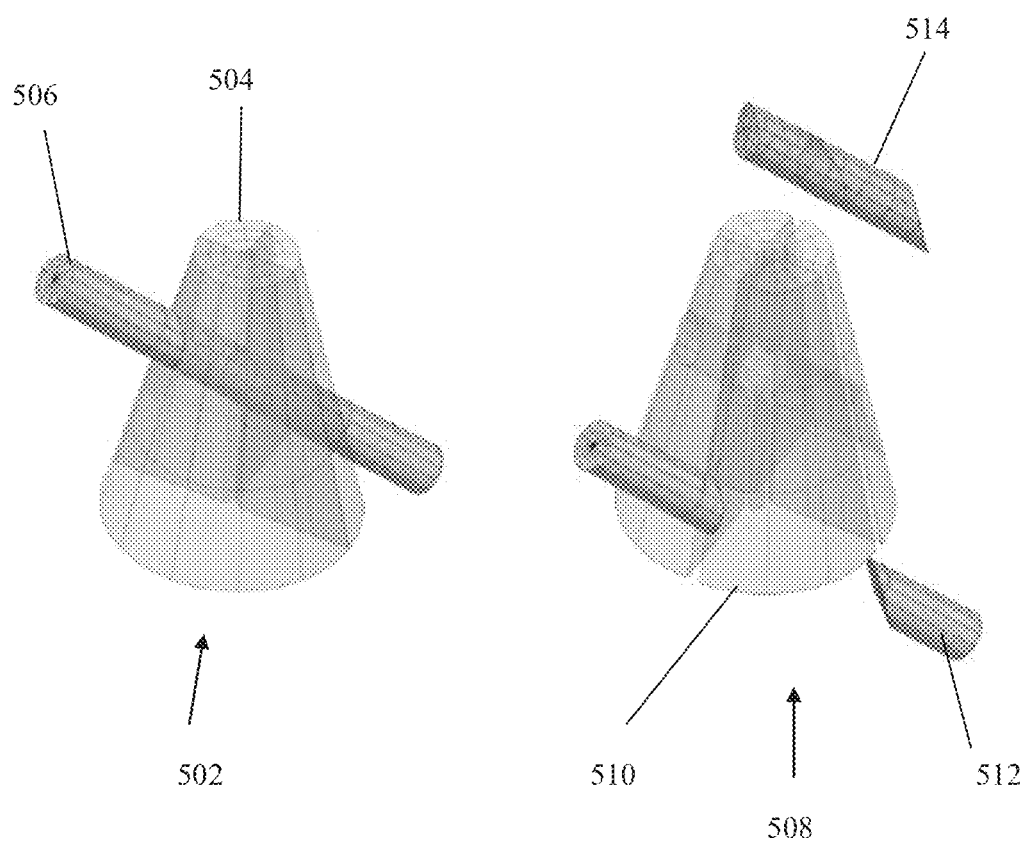
FIG. 5 is a schematic depicting a Boolean union operation between two volumetric models, in accordance with some embodiments of the present invention.

Reference is now made to FIG. 5, which is a schematic depicting a Boolean union operation between two volumetric models, in accordance with some embodiments of the present invention. Schematic 502 depicts a union between a cone 504 and a cylinder 506. Schematic 508 is a partially exploded version of schematic 502 depicting resulting volumetric cells. Schematic 508 includes three categories of resulting volumetric cells. A first category of volumetric cells 510 includes volumetric cells of cone 504 that do no overlap with volumetric cells of cylinder 506. Volumetric cells 510 inherit attribute information only from volumetric cells of cone 504. A second category of volumetric cells 512 includes volumetric cells of cylinder 506 that do not overlap with volumetric cells of cone 504. Volumetric cells 512 inherit attribute information only from volumetric cells of cylinder 506. A third category of volumetric cells 514 includes volumetric cells in the intersecting zone of cone 504 and cylinder 506. Volumetric cells 514 inherit attribute information from both volumetric cells of cone 504 and cylinder 506.

Figure 6:
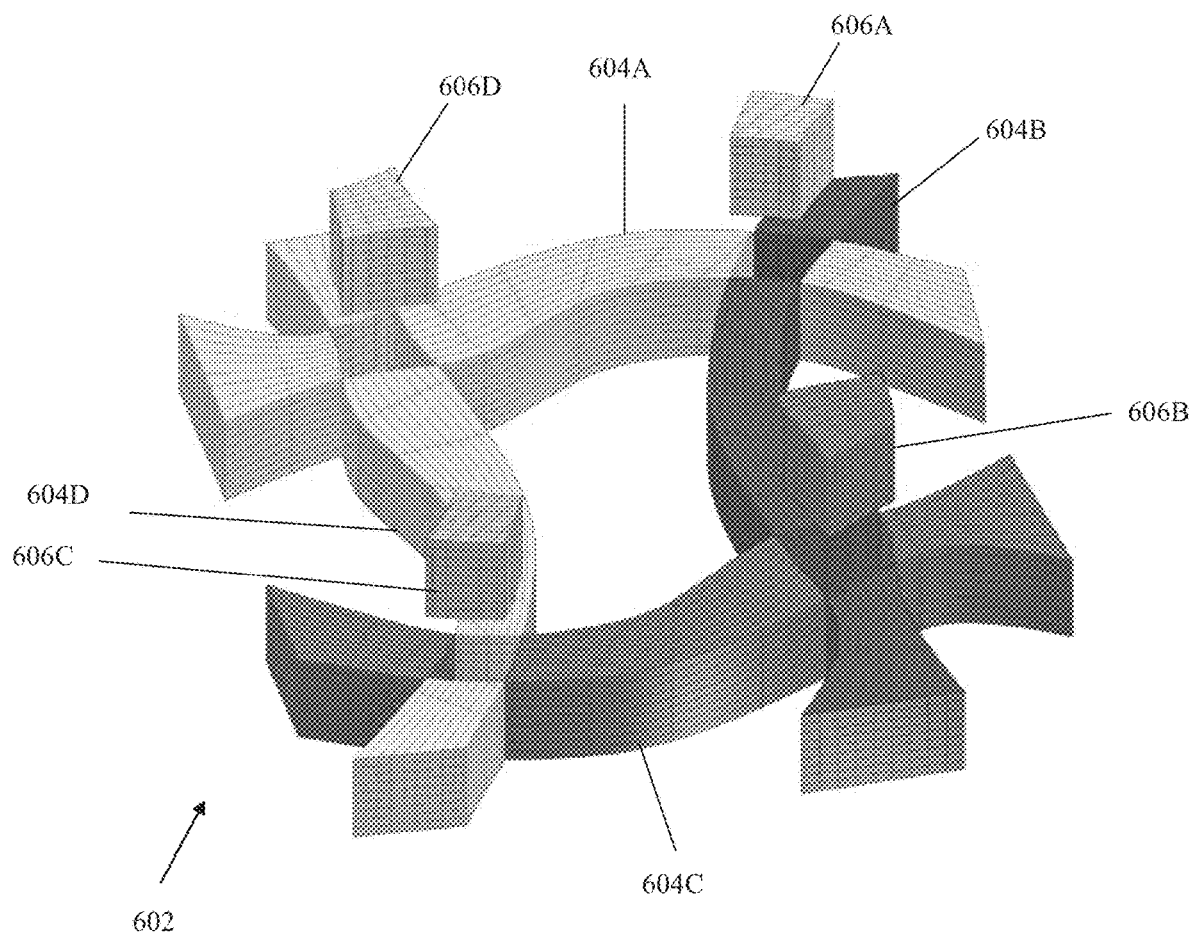
FIG. 6 is a schematic depicting a blending scheme by a blending function, which sums the color attribute in the intersection volumes, applied to a union operation performed between volumetric models, in accordance with some embodiments of the present invention.

Reference is now made to FIG. 6, which is a schematic depicting a blending scheme by a blending function, which sums the color attribute in the intersection volumes, applied to a union operation performed between volumetric models, in accordance with some embodiments of the present invention. Volumetric model 602 is generated by performing a Boolean union operation on four volumetric models 604A-D. Each respective volumetric model 604A-D includes a different color attribute. The intersection volumes 606A-D between respective two volumetric models are represented as respective separate, new, volumetric cells (Volumetric cells 606A-D are shown for clarity as translated up along the Z axis). Each respective volumetric cell 606A-D inherits two color attributes from the respective two original volumetric models. The blending scheme used sums up the colors (clipped to maximally allowed intensity). It is noted that this summation function introduces a $C^{-1}$ discontinuity in the attributes along the intra object volumetric (optionally trimmed) surfaces shared between respective volumetric cells.

Figure 7:
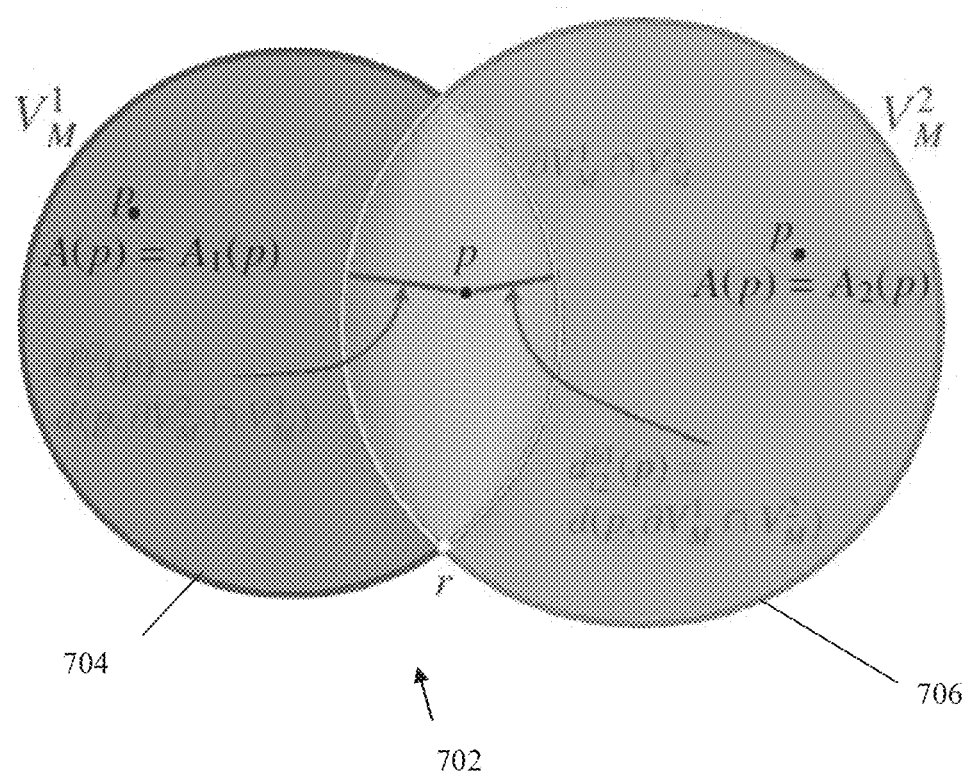
FIG. 7 is a schematic depicting another example of a blending function that is applied to blend a union of two volumetric models, which ensures C0 continuity of attribute values everywhere except at few singular locations, in accordance with some embodiments of the present invention.

Reference is now made to FIG. 7, which is a schematic depicting another example of a blending function that is applied to blend a Boolean union of two volumetric models, which ensures $C^0$ continuity of attribute values everywhere except at a few singular locations, in accordance with some embodiments of the present invention. FIG. 7 depicts a blending function that seeks better continuity of the attribute fields by considering the distance from the border of the intra object volumetric (optionally trimmed) surfaces of the volumetric cell. Volumetric model (VM) 702 is obtained by a Boolean union operation between volumetric model (VM1) 704 and volumetric model (VM2) 706. For clarity of explanation, volumetric models 704 and 706 include one volumetric cell.

The blending function may be mathematically defined as follows:

p denotes a point in VM 702.

d(p; O) denotes the minimal distance from p to O, where d is a $C^0$ continuous function.

A1(p) and A2(p) denote some $C^0$ attribute fields of models VM1 and VM2, respectively, at p.

$d_{i2}^{b1}(p) = d(p, \partial V_M^1 \cap V_M^2)$ denotes the distance from the border of VM1, $\partial$VM1, that is inside VM2 from point p.

The attribute value of model VM, A(p), at p is calculated as the blend of A1(p) and A2(p) according to the following relationship:

$$A(p) = \begin{cases} \frac{d_{i2}^{b1}(p)A_1(p) + d_{i1}^{b2}(p)A_2(p)}{d_{i2}^{b1}(p) + d_{i1}^{b2}(p)}, & p \in V_M^1 \cap V_M^2, \\ A_1(p), & p \in V_M^1 \& p \notin V_M^2, \\ A_2(p), & p \in V_M^2 \& p \notin V_M^1, \end{cases} \quad \text{Equation (2)}$$

A(p) (Equation (2)) ensures $C^0$ continuity of attribute values everywhere in VM by using $C^0$ continuous functions, optionally except at singular locations. Point r, where both $d_{i2}^{b1}(r)$ and $d_{i1}^{b2}(r)$ vanish simultaneously, represents an exemplary singular location. $C^k$ continuous A1(p) and A2(p) and defining higher order versions of Equation (2), for example, by employing $(d_{i1}^{b2}(p))^k$ as blending function, where k>1, better continuity in the attribute fields may be gained at regular locations.

Referring now back to FIG. 1, optionally, at 108, one or more topological queries are executed on the created volumetric model. Exemplary queries include: neighboring volumetric cell of a certain volumetric curve, neighboring volumetric cells of a certain volumetric cell, whether two volumetric cells share an intra object general border (optionally trimmed) surface, whether two or more volumetric cells share a border curve, and whether two or more volumetric cells meet at exactly one point. Additional exemplary queries include: slicing (i.e., intersection with a plane), inclusion test (e.g., of a point), geometric neighborhood information and contacts, and local refinements.

Boolean operations (i.e., union, intersection, and subtraction) performed on two (or more) volumetric models are performed between the volumetric cells of the volumetric models to produce a new set of volumetric cells that are glued together to form the new volumetric model. Each volumetric cell may be represented as a closed 3-manifold that is enclosed in a 2-manifold border (i.e., intra object general border (optionally trimmed) surfaces). A Boolean operation algorithm on volumetric models may be based on algorithms of B-rep Boolean operations between the intra object general border (optionally trimmed) surfaces of the volumetric cells, with a reconstruction of the interior information as a second stage. Boolean operations between B-rep models may be performed, for example, as described with reference to Satoh, T., Chiyokura, H., 1991. Boolean operations on sets using surface data. In: Proceedings of the First ACM Symposium on Solid Modeling Foundations and CAD/CAM Applications. SMA '91. ACM, New York, N.Y., USA, pp. 119-126. Thomas, S. W., 1986. Set Operations on Sculptured Solids. Technical report. University of Utah, Department of Computer Science.

To help understand Boolean operations between the volumetric models described herein, first is presented a discussion of Boolean operations on two B-rep models M1 and M2, with their boundaries represented as sets of trimmed (optionally trimmed) surfaces (i.e., the intra object general border (optionally trimmed) surfaces). The Boolean operation on the B-rep models may be performed as follows:

1. Compute all the intersection curves between the (optionally trimmed) surfaces of M1 and M2. The intersection curves of two (optionally trimmed) surfaces are given in their parametric space. If there is no intersection between the (optionally trimmed) surfaces of M1 and M2, then either they are disjoint or one contains the other. To delineate between these cases, a point inclusion test can be performed, for example, by tracing a ray from a point on one model in an arbitrary direction, and counting the number of intersections between the ray and the other model. The models are disjoint if the number of intersection is even, and contained otherwise.

2. For each (trimmed) (optionally trimmed) surface Ski, i =1, 2 in model Mi, split the trimming curves of Ski by intersecting them with the new intersection curves computed in Step 1, if any. If no intersection curves in (trimmed) (optionally trimmed) surface Ski, move Ski to Step 5.

3. For each intersecting (trimmed) (optionally trimmed) surface from Step 2, use the new intersection curves computed in Step 1 and the splitted old trimming curves computed in Step 2, to create new trimming loops, based on the specific Boolean operation.

4. Classify each trimming loop (new and old) as in/outside according to the orientation and the specific Boolean operation. Loops that are not in the domain are purged.

5. Classify the rest of the non-intersecting (optionally trimmed) surfaces from Step 2 as completely in/outside by border adjacency propagation from the intersecting (optionally trimmed) surfaces.

6. Unite all the classified-as-inside (optionally trimmed) surfaces and glue them topologically to define the final result. Note the classified-as-inside operation depends on the specific Boolean operation.

To understand the Boolean operations over the volumetric models, a few terms are now presented. SVC(VM) denotes the entire set of volumetric cells of volumetric cells of VM. For each volumetric cell, the border of a given volumetric cell VC, $\partial$VC denotes a closed B-rep manifold defined as the union of the (e.g., trimming) sub intra object general border (optionally trimmed) surfaces of VC. STV(VC) denotes the set of all trivariates of volumetric cell VC. To build a volumetric cell, the volumetric cell constructor CVC(S,T), creates a new volumetric cell having S as its set of trimming sub intra object general border (optionally trimmed) surfaces, and T as its set of trivariates (or other multivariate functions).

It is noted that B-rep Boolean operations over freeform geometric objects may be performed on an input of two sets of (optionally trimmed) surfaces (and additional information, including topological data), as the border of the two input geometric objects, returning a set of (optionally trimmed) surfaces as the result (and additional information, including topological data). The B-rep Booleans and the expected V-rep Booleans are in $R^3$ and hence the result of a B-rep Booleans may be used to delineate the boundaries of the result volume representation model. For volumetric models, VM2 and VM2, and their respective boundaries, $\partial$VM/ and $\partial$VM2, the B-rep Boolean operation is denoted by BrepBoolOP($\partial$VM1, $\partial$VM2, BoolOP), where BoolOp can be, for example, UNION, INT (intersection) or SUBTR (Subtraction). BrepBoolOP($\partial$VC1, $\partial$VC2, BoolOP) denotes the B-rep Boolean operation over the boundaries of two volumetric cells. It is assumed that VM1 and VM2 share a common border ($\delta$VM1 $\cap\partial$VM2$\neq$0), for otherwise, either VM1 and VM2 are disjoint or one is enclosed by the other, which represent cases that may be handled using the application of point inclusion tests. A similar assumption is made for volumetric cells.

Boolean operations over volumetric models are now discussed. Reference is made to FIG. 11, which includes pseudocode of a method for performing an intersection of two volumetric models 1102, a subtraction of two volumetric models 1104, and a union of two volumetric models 1106, in accordance with some embodiments of the present invention.

With reference to Intersection Operation 1102, when VM1 and VM2 denote a complex of volumetric cells, the result of a Boolean intersection operation between VM1 and VM2 is the union of volumetric cells that results from Boolean intersection operations over all possible pairs of volumetric cells in VM1 and VM2. The intersection of two volumetric cells, ViC and VjC, amounts to the computation of the border of the volumetric cell of the intersection, using the BrepBoolOP B-rep function. The relevant trivariates in this volumetric cell are included, which are represented as the union of the trivariate sets in ViC and VjC, which allows for management of the attributes in the new intersection volumetric cell.

The subtraction operation 1104 of VM2 from VM1 may be performed one volumetric cell at a time, by subtracting the volumetric cells VjC $\in$ VM2 from volumetric cells ViC E Alternatively or additionally, VM2 may be subtracted in a single operation from each ViC $\in$ VM, which may be simpler and/or more robust.

The union operation 1106 of VM2 and VM1 may be based on the described intersection 1102 method and subtraction method 1104. The union of VM2 and VM1 includes the volumetric cells in VM1i2, VM1s2, and VM2s1. Alternatively, the union includes the volumetric cells in the intersection of VM2 and VM1, the volumetric cells in the subtraction of VM2 from VM1, and the volumetric cells in the subtraction of VM1 from VM2.

Referring now back to FIG. 1, optionally, at 110, the volumetric model undergoes additional processing. Optionally, the volumetric model allows for precise analysis. Exemplary processing includes: slicing by a plane toward heterogeneous AM, integration of intra object general border (optionally trimmed) surfaces using untrimming methods, precise point/curve projections to compute the orthogonal projection of points and curves on the intra object general border (optionally trimmed) surfaces, and contact and penetration depth analysis.

Optionally, the intra object general border surfaces are represented as trimmed surfaces. Trimmed surfaces may be defined as tensor product surfaces with a set of trimming curves. Tools to accurately handle intra object general border surfaces (e.g., trimmed) surfaces and/or multivariate functions (e.g., trivariates) are provided.

Optionally, the intra object general border surfaces represented as trimmed surfaces are processed by a method referred to herein as untrimming. For a trimmed surface St(u, v), DSt represents the trimming domain. St(u, v) may be mapped (optionally precisely) to a set of tensor product patches, via the following process termed untrimming (which reduces the complexity of directly integrating over DSt):

1. Tile DSt by mutually exclusive quads Qi (where i =1, . . . , k) that may include freeform boundaries (including the trimming curves that delineate DSt), as B-spline curves.

2. Parameterize the interior of each quad Qi using the four curves bounding the quad (for example, using the Boolean Sum operation) denoted as Qi(r, t).

3. For each Qi(r, t)=(ui(r, t), vi(r, t)), construct a tensor product (optionally trimmed) surface SQi =St(Qi(r, t))=St (ui(r, t), vi(r, t)), using surface-surface composition, for example, as described with reference to DeRose, T., Goldman, R., Hagen, H., Mann, S., 1993. Functional composition via blossoming. ACM Transactions on Graphics 12 (2), 113-135.

The set {SQi} where i =1, . . . , k precisely tiles and covers the original trimmed surface St(u, v), but includes (optionally only) tensor product patches. While a tight bounding box of a trimmed surface is a challenging task, a tight bounding box for St may be derived by simply computing the tight bounding box of the set {SQi}. The integration over the original trimmed surface St(u, v) may be reduced to integration over the set of tensor product patches {SQi} where i =1, . . . , k.

Note that St represents a Bezier surface, as Qi(r, t) cannot cross knot lines (or alternatively, Qi(r, t) is divided along the knot line, which may no longer be defined as a topological quad, which may undergo further refinement into several smaller quads). It is noted that trimmed B-spline surface St(u, v) may be subdivided into Bezier patches before the untrimming process is applied.

Figure 12:
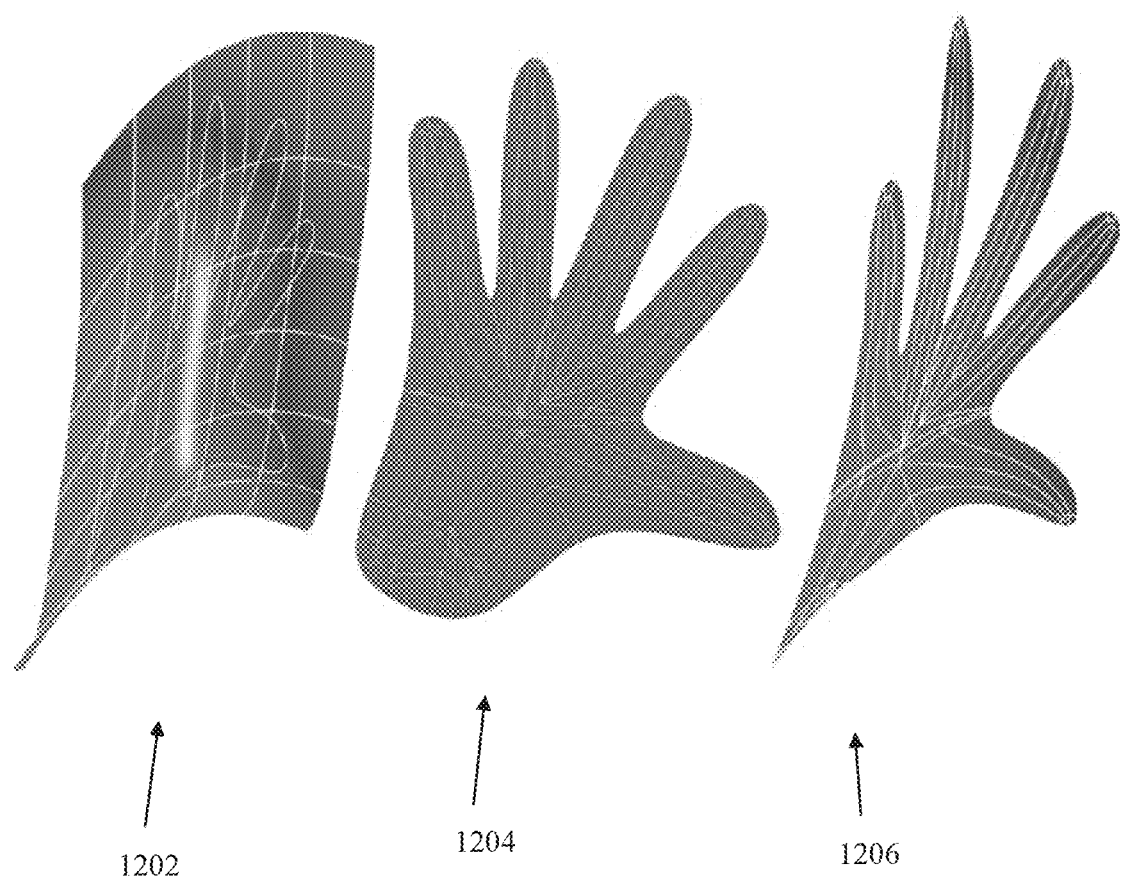
FIG. 12 is a schematic depicting an untrimming process, in accordance with some embodiments of the present invention.

Reference is now made to FIG. 12, which is a schematic depicting the untrimming of a trimmed surface (i.e., intra object general border surface) into a set of tensor product patches, in accordance with some embodiments of the present invention. Schematic 1202 depicts a trimmed surface in the shape of a hand in Euclidean space. Schematic 1204 depicts the parametric domain of the trimmed surface of schematic 1202 including tiles with quads with freeform boundaries. Schematic 1206 depicts the composed tensor product tiles over the trimmed surface of schematic 1202, again in the Euclidean space.

Referring now back to FIG. 1, alternatively or additionally, the volumetric model is processed by calculation of points and/or curve projections. C(t) denotes a parametric curve, and S(u, v) denotes a $C^1$ regular B-spline surface. Orthogonally projecting C(t) into S(u, v) results in a curve(s) lying on S. When C(t) is orthogonally projected to S(u, v), the normal of S at (u, v) pierces C(t).

The (univariate) solution(s) of finding the orthogonal projection of C(t) on S(u, v) may be represented as:

$$\left\langle C(t) - S(u, v), \frac{\partial S(u, v)}{\partial u} \right\rangle = 0, \quad \text{Equations (3)}$$

$$\left\langle C(t) - S(u, v), \frac{\partial S(u, v)}{\partial v} \right\rangle = 0,$$

Set of Equations (3) includes two equations and three unknowns (u, v, t).

The solution of these polynomial constraints is univariate in the (u, v, t) parametric space. S may be evaluated at the (u, v) solution locations and project the solution to the Euclidean space. The constraints in Equation (3) may be simultaneously solved, for example, using the solver method described with reference to Barton, M., Elber, G., Hanniel, I., 2011. Topologically guaranteed univariate solutions of underconstrained polynomial systems via no-loop and single-component tests. Computer-Aided Design 43 (8), 1035-1044., for example, in a reasonable amount of time (e.g., less than a second) using standard existing computing hardware. The orthogonal projection of a point P on (optionally trimmed) surface S(u, v) may be calculated using Equations (3) by substituting P for C(t), which reduces Equation (3) to two constraints in two unknowns (u, v).

Figure 13:
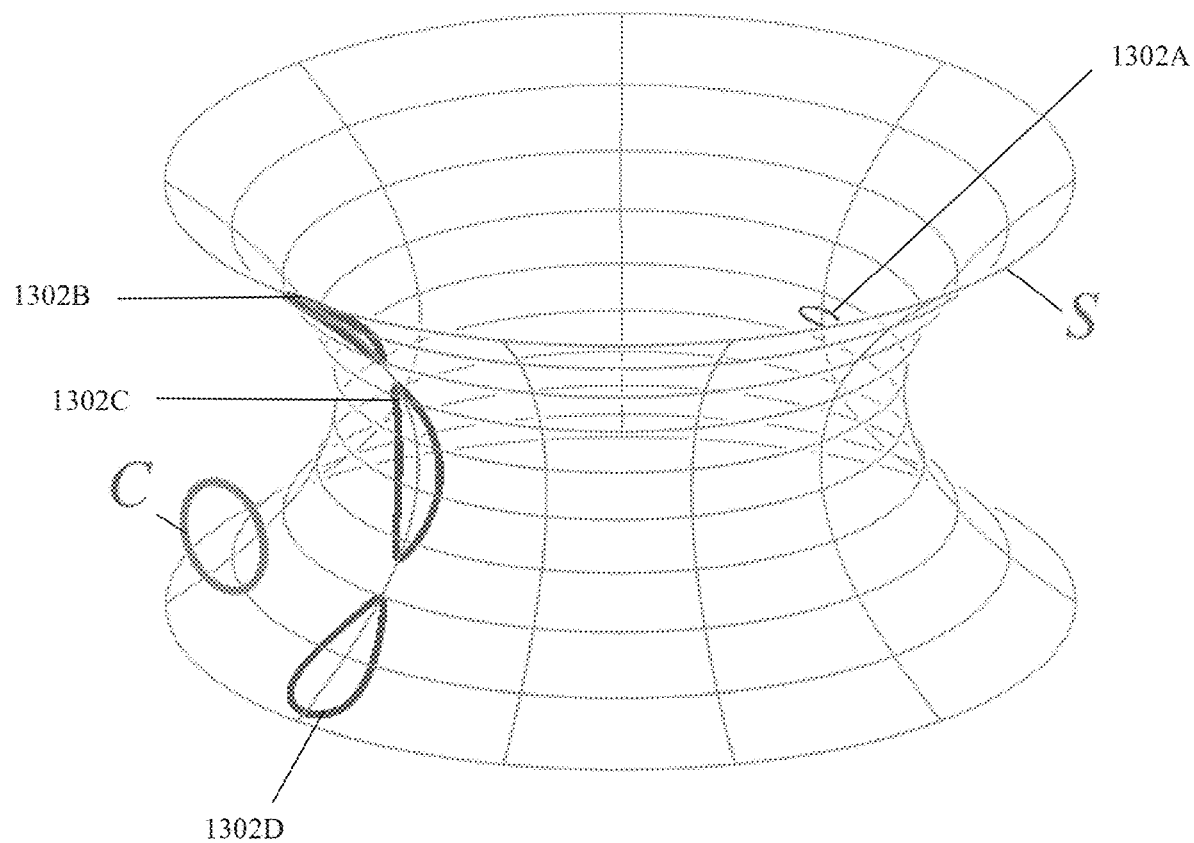
FIG. 13 is a schematic depicting an orthogonal projection of a curve on a (optionally trimmed) surface, in accordance with some embodiments of the present invention.

Reference is now made to FIG. 13, which is a schematic depicting an orthogonal projection of a circular curve C on (optionally trimmed) surface S, in accordance with some embodiments of the present invention. The projection produces four disjoint curve segments as four solution loops 1302A-D.

Referring now back to FIG. 1, alternatively or additionally, the volumetric model is processed by performing a contact and/or maximal penetration depth analysis. The contact analysis may improve contact analysis for ISA, for example, as described with reference to Lorenzis, L. D., Wriggers, P., Hughes, T. J. R., 2014. Isogeometric contact: a review. GAMM Mitteilungen 37 (1), 85-123.

The intersection between the two boundaries of the geometric objects which may be bounding (optionally trimmed) surfaces is detected. The intersection may be curve(s) or single point(s), in singular, first contact, cases. For two $C^1$ continuous regular (optionally trimmed) surfaces S1(u, v) and S2(r, t), finding the extreme penetration of one (optionally trimmed) surface into another (or the minimum distance between two disjoint (optionally trimmed) surfaces) may represent seeking the extreme values of $\|S1(u, v)-S2(r, t)\|$, which may be divided into one or more of the following cases:

1. Extrema may be found on the boundaries. Curve-curve and curve-surface extrema are sought.

2. Extrema may occur at $C^1$ discontinuities that are isoparametric curves for tensor product surfaces, which reduces to curve-curve and curve-surface extrema.

3. Interior extrema (which represents the most complex case) reduces to solving four equations with four unknowns. By differentiating:

$$\|S1(u, v)\text{-}S2(r, t)\|^2 = \langle S1(u, v)\text{-}S2(r, t), S1(u, v)\text{-}S2(r, t)\rangle$$

with respect to the four degrees of freedom (u, v, r, t), the following is obtained:

$$\left\langle S_1(u, v) - S_2(r, t), \frac{\partial S_1(u, v)}{\partial u} \right\rangle = 0, \quad \text{Equations (4)}$$

$$\left\langle S_1(u, v) - S_2(r, t), \frac{\partial S_1(u, v)}{\partial v} \right\rangle = 0,$$

$$\left\langle S_1(u, v) - S_2(r, t), \frac{\partial S_2(r, t)}{\partial r} \right\rangle = 0,$$

$$\left\langle S_1(u, v) - S_2(r, t), \frac{\partial S_2(r, t)}{\partial t} \right\rangle = 0.$$

The constraints in Equations (4) may be solved (simultaneously) to yield the extrema locations, for example, using the solver described with reference to Hanniel, I., Elber, G., 2007. Subdivision termination criteria in subdivision multivariate solvers using dual hyperplanes representations. Computer-Aided Design 39 (5), 369-378, for example, in a reasonable amount of time (e.g., less than a second) using standard existing computing hardware.

Alternatively or additionally, the interior and/or border properties of the volumetric model are automatically updated with an arbitrary desired continuity, for example, $C^0$ continuity, or $C^k$ or $G^k$ where k>0 continuity. The continuity may be along the common intra object general border (optionally trimmed) surfaces' boundaries between volumetric cells.

Alternatively or additionally, the volumetric model is processed to avoid or handle small volumetric cells which may be created during Boolean operations between volumetric models. The small volumetric cells may be removed or processed, for example, during analysis of the volumetric model.

At 112, the created volumetric model is provided, for example, presented on a display (e.g., user interface 226), stored locally (e.g., in data repository 208), and/or transmitted to a remote client (e.g., 216) and/or server (e.g., 214).

The volumetric model may be used in a simulation, for example, to simulate stresses within the volumetric model (e.g., when the volumetric model represents a mechanical part).

The volumetric model may be used in an analysis, for example, to evaluate application of forces to the volumetric model.

The volumetric model may be used for manufacturing a physical product, for example, by manufacturing system 220, for example, an additive manufacturing system.

The volumetric model may be implemented and integrated into an existing B-Rep modeler, for example, using an integration software interface designed for integration with the existing B-Rep modeler such as a software development kit (SDK), application programming interface (API), library file, adherence to a predefined format, or other code integration methods. For example the IRIT solid modeler as described with reference to Elber, G., 2010. *Irit 10 user's manual*. The IRIT solid modeler may be used to perform the B-rep Boolean operations on the border (optionally trimmed) surfaces and to generate the trivariate using the constructors described herein. The polynomial constraints described herein may be solved using the IRIT's multivariate polynomial solver described with reference to Barton, M., Elber, G., Hanniel, I., 2011. Topologically guaranteed univariate solutions of underconstrained polynomial systems via no-loop and single-component tests. Computer-Aided Design 43 (8), 1035-1044. Elber, G., Kim, M.-S., 2001. Geometric constraint solver using multivariate rational spline functions. In: Proceedings of the sixth ACM symposium on Solid modeling and applications. ACM, pp. 1-10. Hanniel, I., Elber, G., 2007. Subdivision termination criteria in subdivision multivariate solvers using dual hyperplanes representations. Computer-Aided Design 39 (5), 369-378.

Reference is now made to FIGS. 15-18, which depict fairly complex volumetric models created using the systems and/or methods described herein, in accordance with some embodiments of the present invention. Each of the Figures presents a single volumetric model, in which each volumetric cell is also depicted in an exploded representation, where each volumetric cell is translated in a different direction. The volumetric cells were created using the primitive shapes (e.g., a cone) described herein, and/or constructor shapes described herein, for example, the extruded volumes, ruled volumes, swept volumes, volumes of revolution and Boolean sum operation. Boolean operations (as described herein) were applied between the basic volumetric models.

Figure 15:
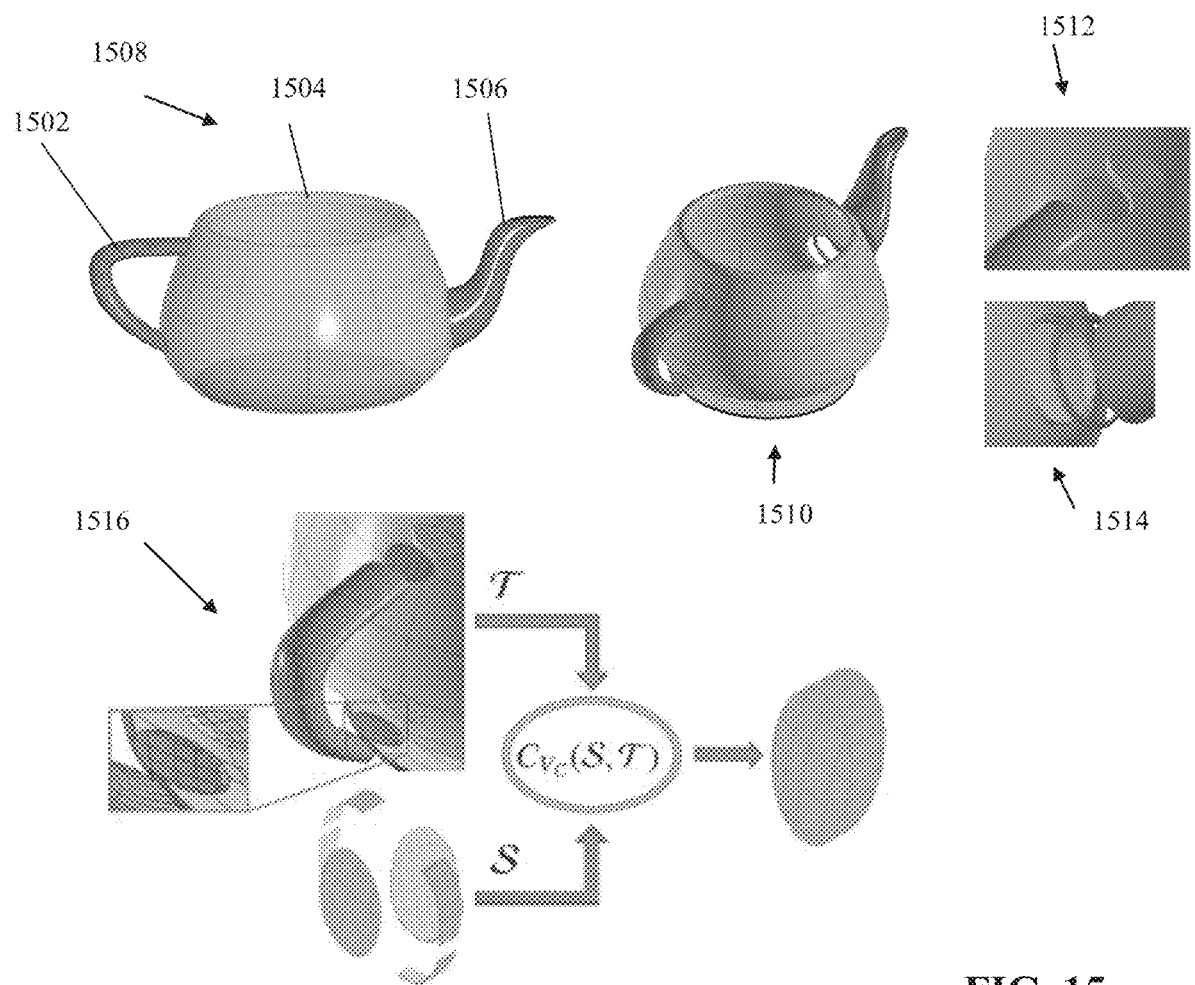
FIG. 15 is a schematic of an exemplary volumetric model, in accordance with some embodiments of the present invention.

FIG. 15 depicts a volumetric model of a Utah teapot created using three union operations and one substitution operation. Handle 1502 represents a volumetric Boolean Sum version of the B-rep (optionally trimmed) surface. Body 1504 and Spout 1506 represent ruled volumes between the original Body and Spout surface and a small offset surface. Schematic 1508 depicts the complete volumetric teapot consisting of 7 volumetric cells. Schematic 1510 depicts the volumetric cells in an exploded view. Schematic 1512 depicts a zoom in into the area near handle 1502. Schematic 1514 depicts a zoom in into the area near spout 1506. Schematics 1516 depict the construction of a volumetric cell of the bottom shared volume between the teapot's handle and the body trivariates.

Figure 16:
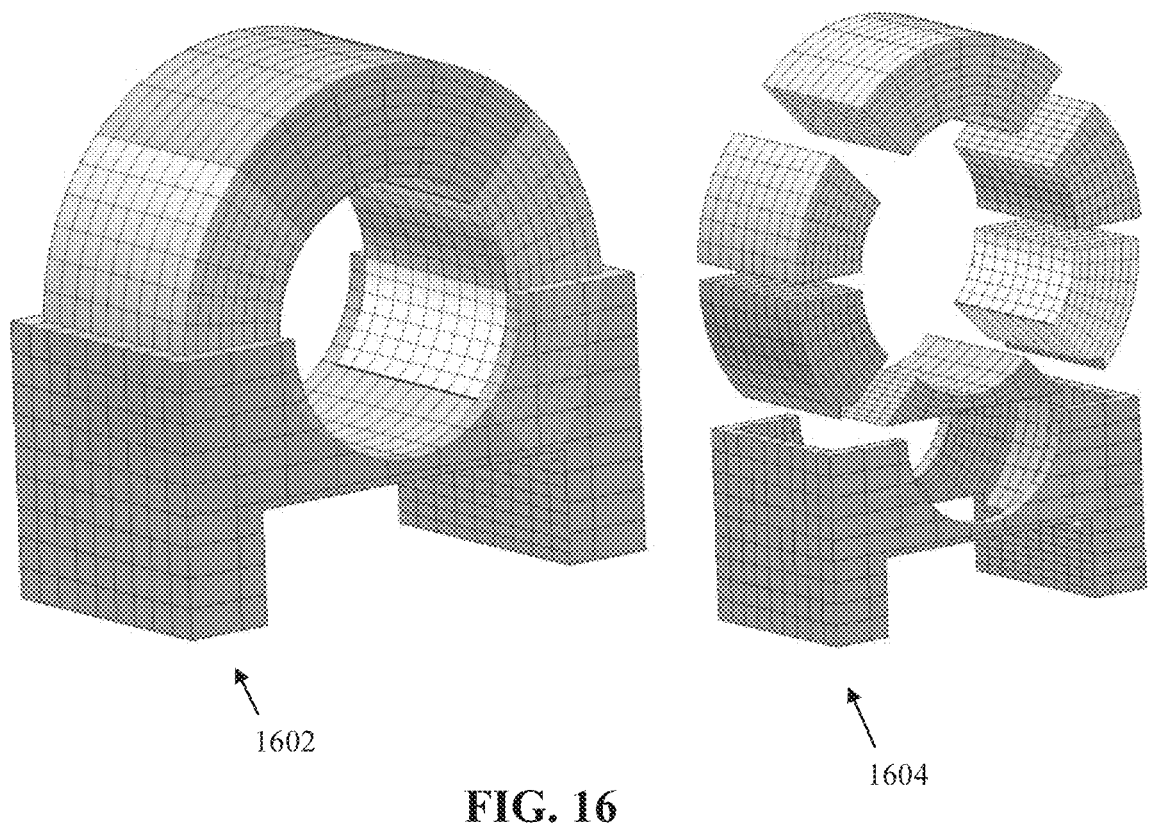
FIG. 16 is a schematic of an exemplary volumetric model, in accordance with some embodiments of the present invention.

FIG. 16 depicts a solid volumetric model created using one union operation, and two subtractions operations. The primitive shapes used are non-singular. Schematic 1602 depicts the complete volumetric shape consisting of 7 volumetric cells. Schematic 1604 depicts the volumetric cells in an exploded view.

Figure 17:
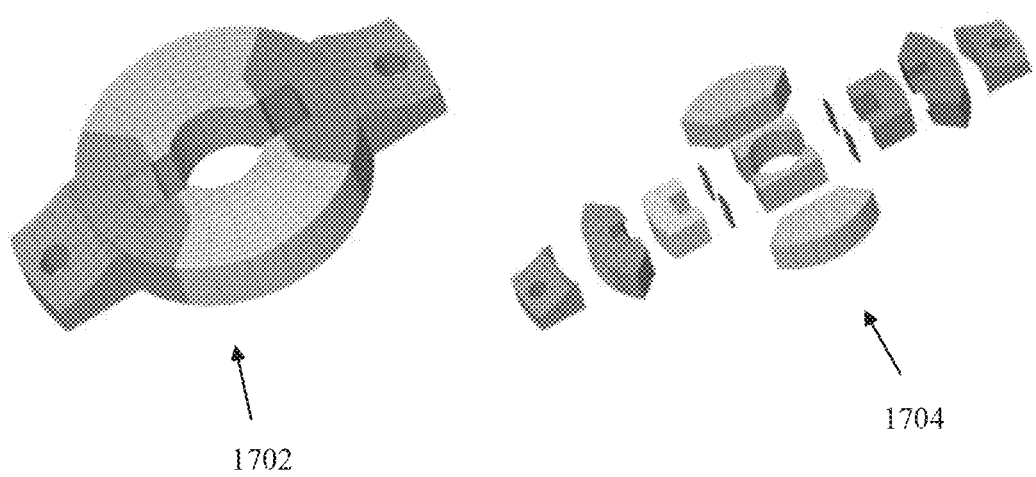
FIG. 17 is a schematic of an exemplary volumetric model, in accordance with some embodiments of the present invention.

FIG. 17 depicts another solid volumetric model created using two union operations, five subtraction operations, and one intersection operation. The primitive shapes used are non-singular. Schematic 1702 depicts the complete volumetric shape consisting of 12 volumetric cells. Schematic 1704 depicts the volumetric cells in an exploded view.

Figure 18:
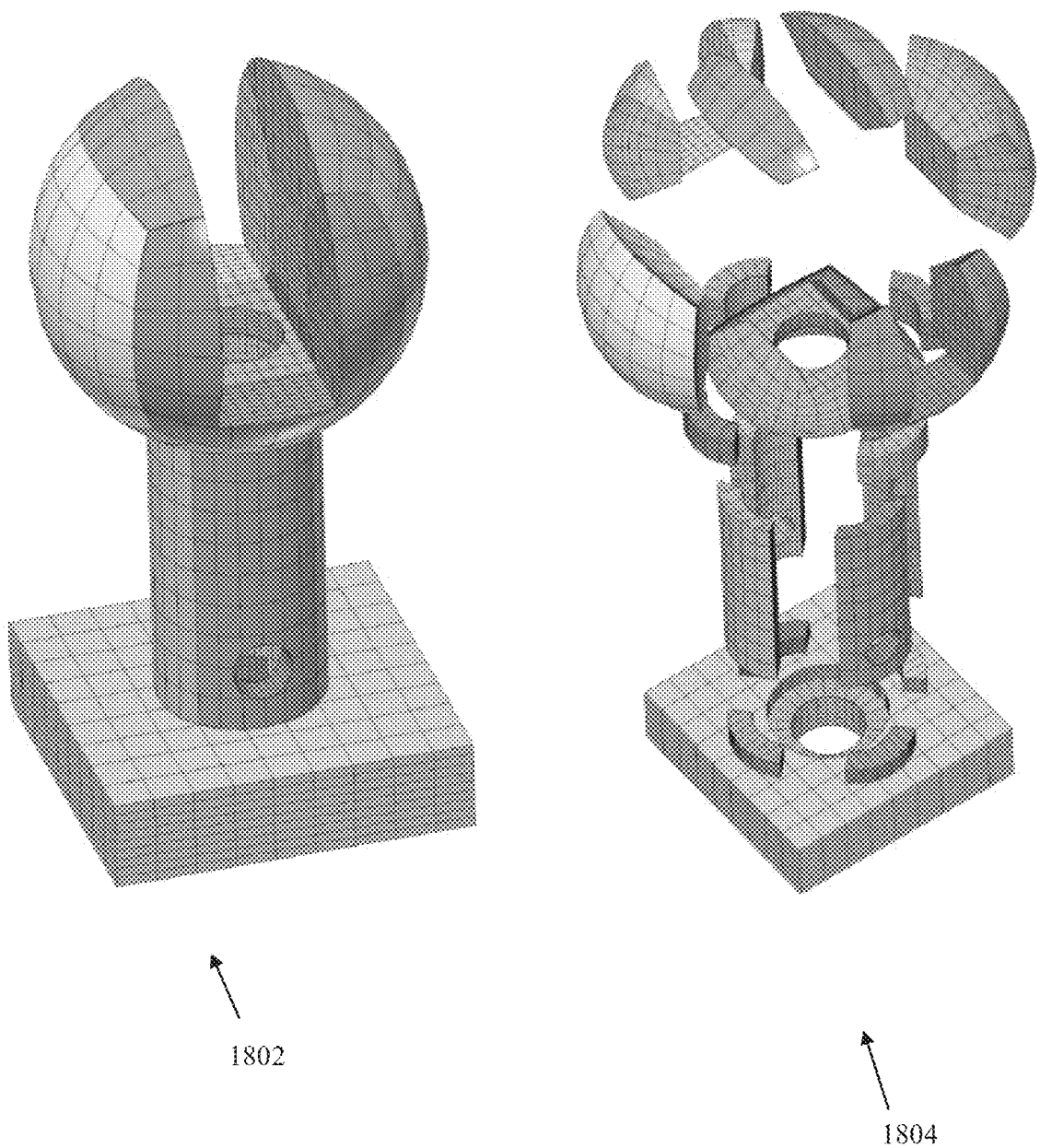
FIG. 18 is a schematic of an exemplary volumetric model, in accordance with some embodiments of the present invention.

FIG. 18 depicts yet another solid volumetric model created using two union operations, and three subtraction operations. The primitive shapes used are non-singular. Schematic 1802 depicts the complete volumetric shape consisting of 19 volumetric cells. Schematic 1804 depicts the volumetric cells in an exploded view.

TABLE 1

| Model | # volumetric cells | Trivariate orders range | Trivariate's sizes range | Gluing Time (Secs.) | Time (Secs.) |
|---|---|---|---|---|---|
| Teapot (FIG. 15) | 7 | [2, 2, 2]-[4, 2, 2] | [4, 2, 2]-[13, 13, 7] | 0.45 | 35.0 |
| Solid (FIG. 16) | 7 | [2, 2, 2]-[4, 2, 2] | [2, 2, 2]-[4, 2, 2] | 0.08 | 2.9 |
| Solid (FIG. 17) | 12 | [2, 2, 2]-[4, 2, 2] | [2, 2, 2]-[4, 2, 2] | 0.98 | 17.6 |
| Solid (FIG. 18) | 19 | [2, 2, 2]-[5, 5, 2] | [2, 2, 2]-[5, 5, 2] | 0.24 | 6.2 |

Table 1 presents statistics on the process of generating the volumetric models depicted in FIGS. 15-18. The number of volumetric cells and the sizes of the trivariates that were used to construct the volumetric model are provided. The running times of the Boolean operation algorithm are presented. The models were constructed on a Macbook-Pro i7 2.7 Ghz machine, running Window 7 64 bit.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

It is expected that during the life of a patent maturing from this application many relevant initial definitions of geometric objects will be developed and the scope of the term initial definition is intended to include all such new technologies a priori.

As used herein the term "about" refers to ±10%.

The terms "comprises", "comprising", "includes", "including", "having" and their conjugates mean "including but not limited to". This term encompasses the terms "consisting of" and "consisting essentially of".

The phrase "consisting essentially of" means that the composition or method may include additional ingredients and/or steps, but only if the additional ingredients and/or steps do not materially alter the basic and novel characteristics of the claimed composition or method.

As used herein, the singular form "a", "an" and "the" include plural references unless the context clearly dictates otherwise. For example, the term "a compound" or "at least one compound" may include a plurality of compounds, including mixtures thereof.

The word "exemplary" is used herein to mean "serving as an example, instance or illustration". Any embodiment described as "exemplary" is not necessarily to be construed as preferred or advantageous over other embodiments and/or to exclude the incorporation of features from other embodiments.

The word "optionally" is used herein to mean "is provided in some embodiments and not provided in other embodiments". Any particular embodiment of the invention may include a plurality of "optional" features unless such features conflict.

Throughout this application, various embodiments of this invention may be presented in a range format. It should be understood that the description in range format is merely for convenience and brevity and should not be construed as an inflexible limitation on the scope of the invention. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Whenever a numerical range is indicated herein, it is meant to include any cited numeral (fractional or integral) within the indicated range. The phrases "ranging/ranges between" a first indicate number and a second indicate number and "ranging/ranges from" a first indicate number "to" a second indicate number are used herein interchangeably and are meant to include the first and second indicated numbers and all the fractional and integral numerals therebetween.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Although the invention has been described in conjunction with specific embodiments thereof, it is evident that many alternatives, modifications and variations will be apparent to those skilled in the art. Accordingly, it is intended to embrace all such alternatives, modifications and variations that fall within the spirit and broad scope of the appended claims.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention. To the extent that section headings are used, they should not be construed as necessarily limiting.

What is claimed is:

1. A method of design and analysis of a geometric object comprising:
   receiving an initial definition of the geometric object in a coordinate system;
   generating a volumetric model according to said initial definition, said volumetric model comprises:
   a plurality of volumetric cells each represented by at least one multivariate of three variables or more function, and
      a plurality of intra object general border surfaces in general orientation each defines topological adjacency between at least two of said plurality of volumetric cells;
   wherein at least one of said intra object general border surfaces comprises a trimmed surface, and the method further comprising:
   tiling a domain of said trimmed surface with mutually exclusive quads having freeform boundaries;
   parameterizing an interior of each respective quad using curves bounding said quad;
   constructing a set of tensor product patches that tiles and covers said trimmed surface; and
   integrating over said trimmed surface based on integrating over a set of said tensor product patches.

2. The method of claim 1, wherein said initial definition is received from a source selected from a group consisting of: a computer aided design (CAD) user interface (UI), a 3D scan, a CT scan, an MRI scan, a 3D scanner, a medical imaging device, a coordinate measuring machine (CMM), and an existing B-rep model.

3. The method of claim 1, wherein said multivariate of three variables or more function is a trimmed multivariate of three variables or more function.

4. The method of claim 1, wherein said multivariate of three variables or more function is a B-spline multivariate of three variables or more function.

5. The method of claim 1, wherein said volumetric model is a primitive shape selected from a group consisting of a box, a cylinder, a cone, a sphere, and a torus, or a basic model constructor selected from a group consisting of an extruded volume, a volume of revolution, a ruled volume, Boolean Sum, and a sweep volume.

6. The method of claim 5, wherein said primitive shape is non-singular.

7. The method of claim 1, wherein said volumetric model is the result of a volumetric Boolean set operation between at least two simpler volumetric models.

8. The method of claim 1, wherein at least one of said plurality of volumetric cells is associated with at least one attribute field having a value defining an interior, constant, property of the geometric object.

9. The method of claim 1, wherein at least one attribute field having a value defining an interior of at least one volumetric cell is different from a value of an exterior property of the geometric object.

10. The method of claim 1, wherein at least one of said plurality of volumetric cells is associated with at least one attribute field having a value defining an interior, varying, property of the geometric object.

11. The method of claim 10, wherein said at least one attribute field includes an indication of at least one material for manufacturing of the respective volumetric cell, wherein the geometric object is manufactured according to the at least one attribute field using manufacturing methods employing heterogeneous materials defined by the respective at least one material of respective volumetric cells.

12. The method of claim 10, wherein said at least one attribute comprises non-geometric datasets selected from the group consisting of: material properties, stress, stiffness, conductivity, resistance, inductivity, pressure, temperature, speed, accelerations, viscosity, forces, density, translucency, color, texture, and border properties.

13. The method of claim 1, further comprising:
   representing overlapping volumes of a volumetric Boolean set operation of said geometric object and an additional geometric object having another volumetric model that comprises a plurality of other volumetric cells by a volumetric Boolean set operation volumetric model that:

includes a plurality of new intra object general border surfaces at least some define topological adjacency between at least one of said plurality of volumetric cells and at least one of said plurality of other volumetric cells.

14. The method of claim 1, further comprising:
representing overlapping volumes of a union, intersection or subtraction of said geometric object and an additional geometric object having another volumetric model that comprises a plurality of other volumetric cells by a plurality of new volumetric cells; wherein each of at least some of said plurality of new volumetric cells comprises at least one attribute field having a value defining an interior property of a cell of said union, intersection or subtraction, said value is calculated according to at least one blending function that combines values of said at least one attribute field from one of said plurality of volumetric cells and one of said plurality of other volumetric cells.

15. The method of claim 1, wherein a respective said intra object general border surface comprises a left sub intra object general border surface and a right sub intra object general border surface; wherein each of said left and right sub intra object general border surfaces is associated with a different volumetric cell from said plurality of volumetric cells.

16. The method of claim 1, wherein a respective said intra object general border surface is comprised of a first intra object general border surface and a second intra object general border surface of the same volumetric cell.

17. The method of claim 1, wherein each of said plurality of intra object general border surfaces defines a curved, trimmed, B-spline surface.

18. The method of claim 1, wherein said initial definition is an existing boundary B-rep model; wherein said volumetric model inherits at least geometric boundaries of said existing boundary B-rep model.

19. The method of claim 18, wherein said initial definition comprises a constructive solid geometry (CSG) tree, wherein said volumetric model is created by mapping said CSG tree of said B-rep model to a CSG tree of said volumetric model.

20. The method of claim 1, further comprising automatically updating interior and border properties of the volumetric model with an arbitrary desired continuity.

21. The method of claim 1, wherein said volumetric model comprises at least one of a volumetric curve and a volumetric point that each further defines said topological adjacency between at least two of said plurality of volumetric cells.

22. The method of claim 1, further comprising processing a topological query applied to the volumetric model.

23. The method of claim 1, wherein said volumetric model comprises a 3D volumetric model.

24. The method of claim 1, wherein said intra object general border surfaces comprise trimmed surfaces.

25. A system for design and analysis of a geometric object, the system comprising:
a program store storing code; and
a processor coupled to the program store for implementing the stored code, the code comprising:
code to receive an initial definition of the geometric object in a coordinate system, and generate a volumetric model according to said initial definition, said model comprises a plurality of volumetric cells each represented by at least one multivariate of three variables or more function, and a plurality of intra object general border surfaces in general orientation each defines topological adjacency between at least two of said plurality of volumetric cells;
wherein at least one of said intra object general border surfaces comprises a trimmed surface, and the processor further implements a code for:
tiling a domain of said trimmed surface with mutually exclusive quads having freeform boundaries;
parameterizing an interior of each respective quad using curves bounding said quad;
constructing a set of tensor product patches that tiles and covers said trimmed surface;
and
integrating over said trimmed surface based on integrating over a set of said tensor product patches.

26. The system of claim 25, wherein the volumetric model is integrated into code of an existing B-Rep modeler using an integration software interface.

27. A computer program product comprising a non-transitory computer readable storage medium storing program code thereon for implementation by a processor of a system for design and analysis of a geometric object, comprising:
instructions to receive an initial definition of the geometric object in a coordinate system; and
instructions to generate a volumetric model according to said initial definition, said volumetric model comprises:
a plurality of volumetric cells each represented by at least one multivariate of three variables or more function, and
a plurality of intra object general border surfaces in general orientation each defines topological adjacency between at least two of said plurality of volumetric cells;
wherein at least one of said intra object general border surfaces comprises a trimmed surface, and the program code further comprising instructions for:
tiling a domain of said trimmed surface with mutually exclusive quads having freeform boundaries;
parameterizing an interior of each respective quad using curves bounding said quad;
constructing a set of tensor product patches that tiles and covers said trimmed surface; and
integrating over said trimmed surface based on integrating over a set of said tensor product patches.

* * * * *